(12) United States Patent
Mesarovic et al.

(10) Patent No.: US 6,504,496 B1
(45) Date of Patent: Jan. 7, 2003

(54) SYSTEMS AND METHODS FOR DECODING COMPRESSED DATA

(75) Inventors: Vladimir Mesarovic, Austin, TX (US); Raghunath Krishna Rao, Austin, TX (US); Miroslav Dokic, Austin, TX (US); Sachin Sunil Deo, Austin, TX (US); Nariankadu Datareya Hemkumar, Rochester, MN (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/832,290

(22) Filed: Apr. 10, 2001

(51) Int. Cl.[7] ................................................. H03M 7/00
(52) U.S. Cl. ........................................ 341/106; 341/51
(58) Field of Search ................................ 341/106, 107, 341/67, 87; 707/10, 1, 3, 203

(56) References Cited

U.S. PATENT DOCUMENTS 6,088,699 A * 7/2000 Gampper ..................... 341/106

* cited by examiner

Primary Examiner—Brian Young
(74) Attorney, Agent, or Firm—Barry S. Newberger; Winstead Sechrest & Minick P.C.

(57) ABSTRACT

A method of decoding an encoded bitstream. The method includes performing a two-table lookup. A first table is addressed in response to a first plurality of bits from the bitstream. An address into a second table is generated using a value in an entry in said first table accessed in the addressing step. A value (representing the decoded value corresponding to the codeword in the bitstream) in an entry in said second table at the address from the generating step is output.

26 Claims, 14 Drawing Sheets

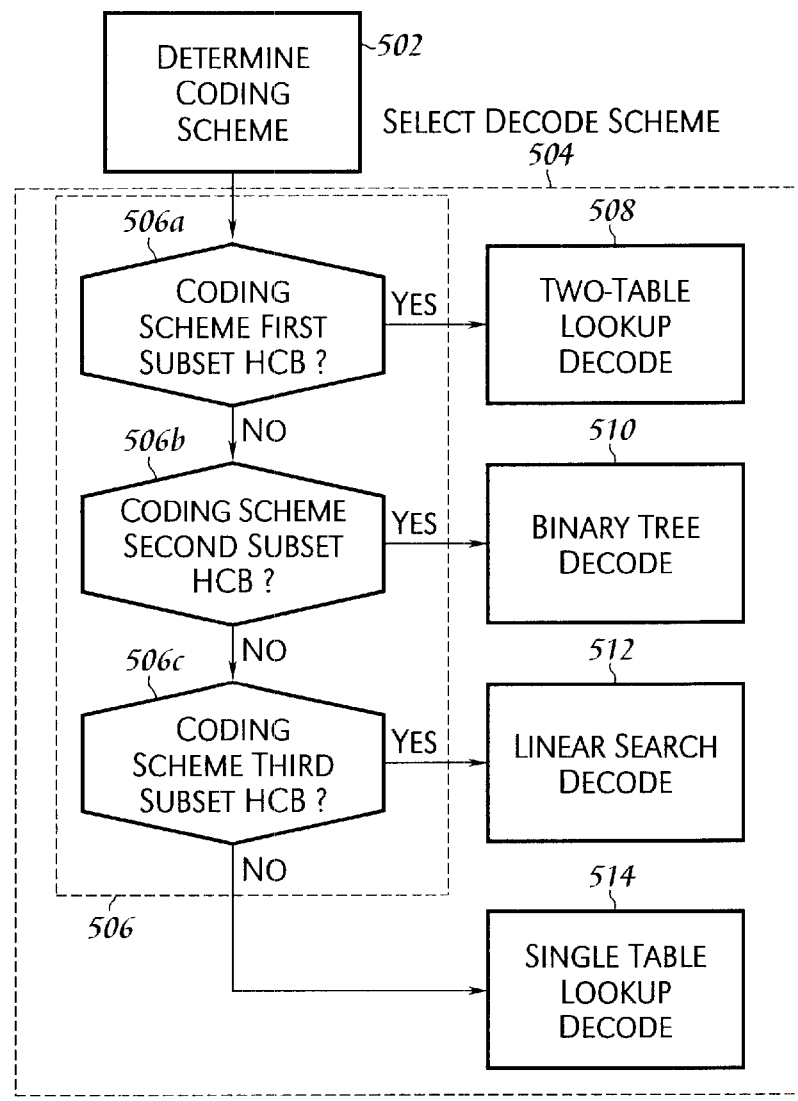
Fig. 5
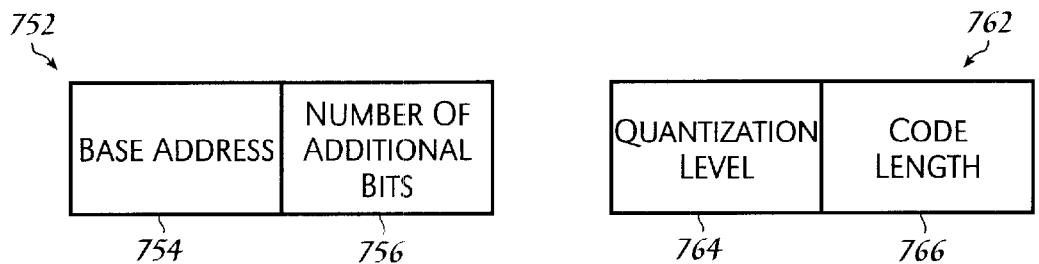
Fig. 7.1
Fig. 7.2

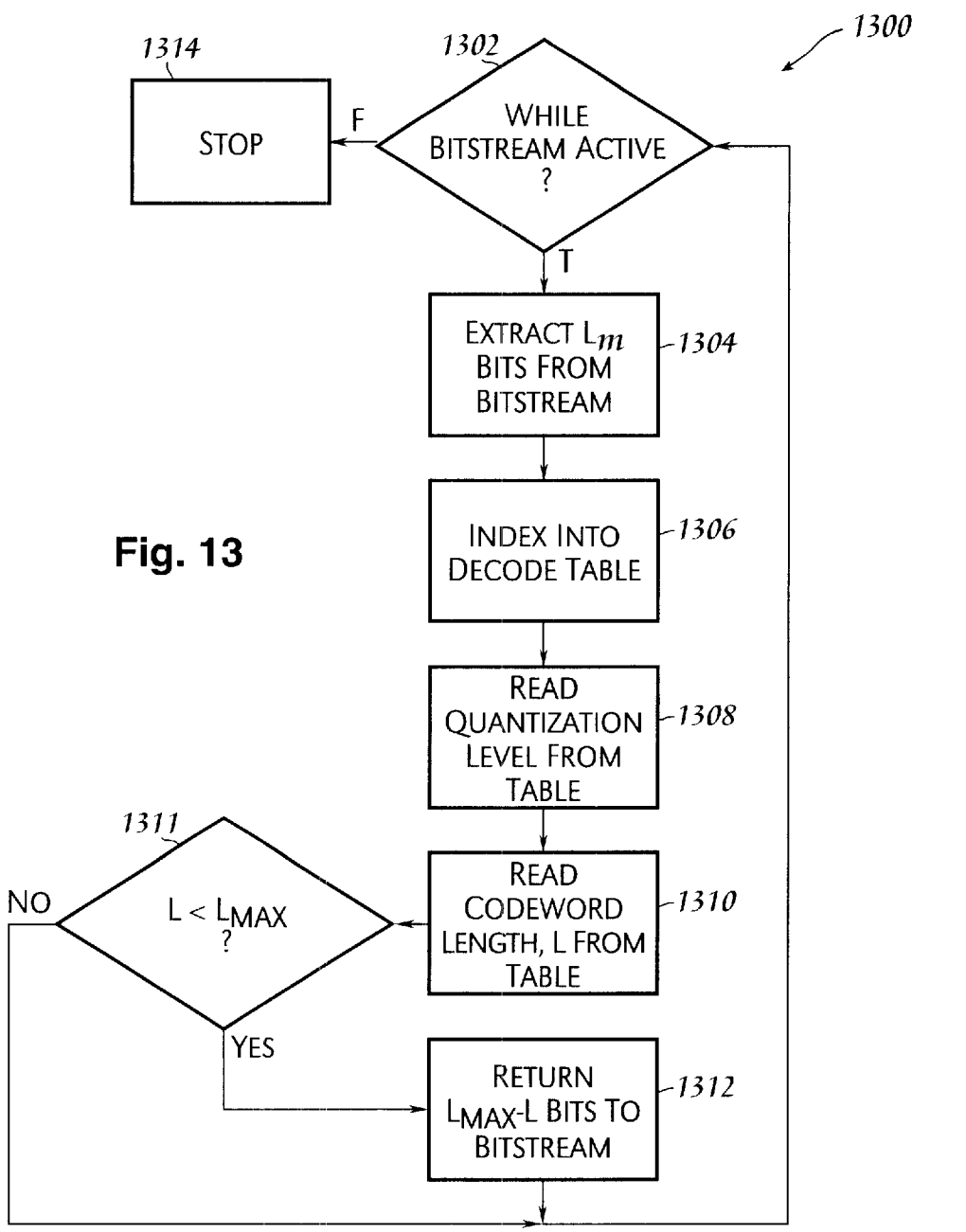
Fig. 13
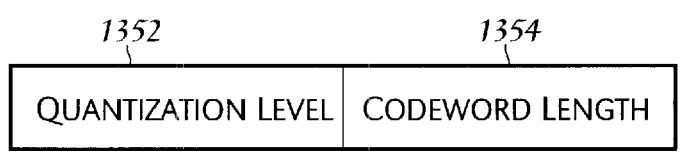
Fig. 13.1

SYSTEMS AND METHODS FOR DECODING COMPRESSED DATA

CROSS-REFERENCE TO RELATED APPLICATION

The following co-pending and co-assigned application contain related information and is hereby incorporated by reference:

Ser. No. 09/771,103 entitled "PCM BUFFERING SYSTEM AND METHOD", by inventors Mesarovic and Dokic, filed January 26, currently pending.

BACKGROUND OF THE INVENTION

1. Field of the Invention

The present invention relates in general to digital signal processing and in particular to systems and methods for decoding data applied in a compressed format in such digital processing systems.

2. Description of the Related Art

Modem signal processing systems, such as those found, for example, in commercial and consumer audio products, commonly received streamed data in compressed formats, thereby reducing bandwidth requirements on the data transport channels. This has been, at least in part, spurred by the use of the Internet as a medium for the distribution of audio and video content, in addition to the textual information that typified the early years of the Internet. Additionally, the traditional broadcast media, radio and television, for example, are introducing direct digital broadcast channels over which content will be streamed to consumers.

The use of coding techniques to compress the digital data prior to its being sent over the communication channel, reduces the bandwidth requirements that the channel must support. Conversely, a channel having a fixed bandwidth can accommodate more data streams, if the data streams are in a compressed format.

For example, the MPEG-4 audio standard provides a set of protocols for encoding audio signals. The protocols include a complete set of tools for coding low and high bit rate, natural and synthetic speech and music. A general audio coding portion of MPEG-4 is based on the MPEG-2 Advanced Audio enCoding (AAC) standard. AAC has become very popular because it preserves audio quality, making it advantageous, particularly for high quality audio systems.

Nonetheless, the properties of AAC complicate AAC decoder implementations. Memory requirements may be substantial, particularly in the case of multi-channel audio. Additionally, AAC provides a multiplicity of bit rates, tools, and profiles defined within the AAC specification. Additionally, the algorithms in the AAC definition have been designed to be implemented on a thirty-two-bit (32-bit) floating point engine. These characteristics of AAC impose stringent demands on the AAC decoder in an audio system by underlying MIPS and/or cost requirements complicated.

In particular, an AAC encoded audio stream may be compressed using a Huffman compression scheme selected from one of twelve Huffman codebooks (HCB) specified within the AAC. Moreover, the encoder may, dynamically, select the HCB depending on the characteristics of the audio source. Consequently, there is a need in the art for systems and methods to decode compressed audio bitstreams, such as those in accordance with the MPEG-4 AAC, and other encoding schemes, that operate within a selected MIPS budget and/or cost efficiency.

SUMMARY OF THE INVENTION

According to the principles of the present invention a method for decoding an encoded bitstream is disclosed. The method includes performing a two-table lookup. A first table is addressed in response to a first plurality of bits from the bitstream. An address into a second table is generated using a value in an entry in said first table accessed in the addressing step. A value (representing the decoded value corresponding to the codeword in the bitstream) in an entry in said second table at the address from the generating step is output.

The inventive concepts allow for the decoding of a bitstream constituting a sequence of encoded digital data, such as digital audio information encoded using variable-length codewords, such as Huffman encoding. Implementation of the inventive principles does not require an inordinate amount of look-up table memory or the execution of a burdensome number of additional instructions.

BRIEF DESCRIPTION OF THE DRAWINGS

For a more complete understanding of the present invention, and the advantages thereof, reference is now made to the following descriptions taken in connection with the accompanying drawings, in which:

FIG. 5 illustrates, in flow chart form, a decoding methodology in accordance with an embodiment of the present invention;

FIGS. 13 and 13.1 illustrate, another alternative embodiment of a process for decoding compressed data values used with the methodology of FIG. 5.

DETAILED DESCRIPTION

Figure 1A:
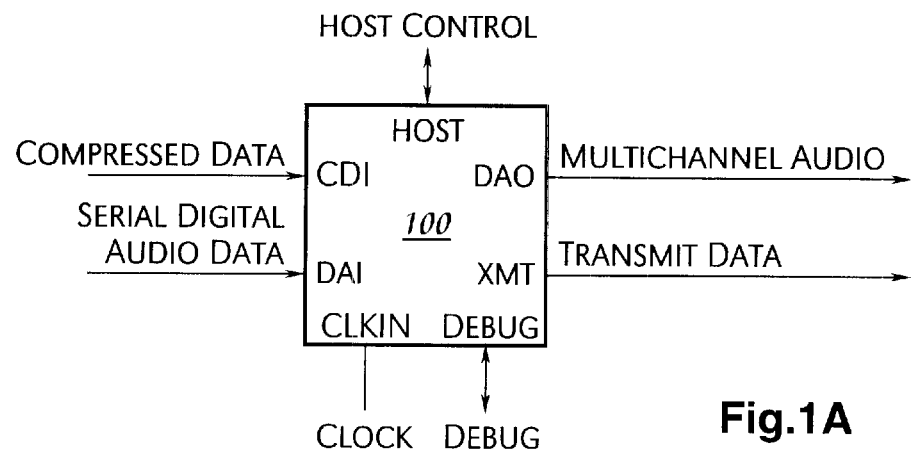
FIG. 1A is a diagram of a multi-channel audio decoder employing the principles of the present invention.

In the following description, numerous specific details are set forth, such as specific encoding protocols, codebooks, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1A is a general overview of an audio information decoder 100. Decoder 100 is operable to receive data in any one of a number of formats, including compressed data conforming, for example, to the MPEG-4 AAC algorithm (as defined in ISO/IEC 14493-3 standard promulgated by the International Organization for Standards (ISO)) and AC-3 digital audio compression standard, (as defined by the United States Advanced Television System Committee) through a Compressed Data Input port ("CDI"). An independent Digital Audio Input ("DAI") port provides for the input of PCM, S/PDIF, or non-compressed digital audio data.

A digital audio output ("DAO") port provides for the output of multiple-channels of decompressed digital audio data. Independently, decoder 100 can transmit data in an S/PDIF ("Sony-Phillips Digital Interface") format, for example, through a transmit port XMT.

Decoder 100 operates under the control of a host microprocessor through a host port "HOST" and supports debugging by an external debugging system through the debug port "DEBUG." The "CLK" port supports the input of a master clock for generation of the timing signals within decoder 100.

Figure 1B:
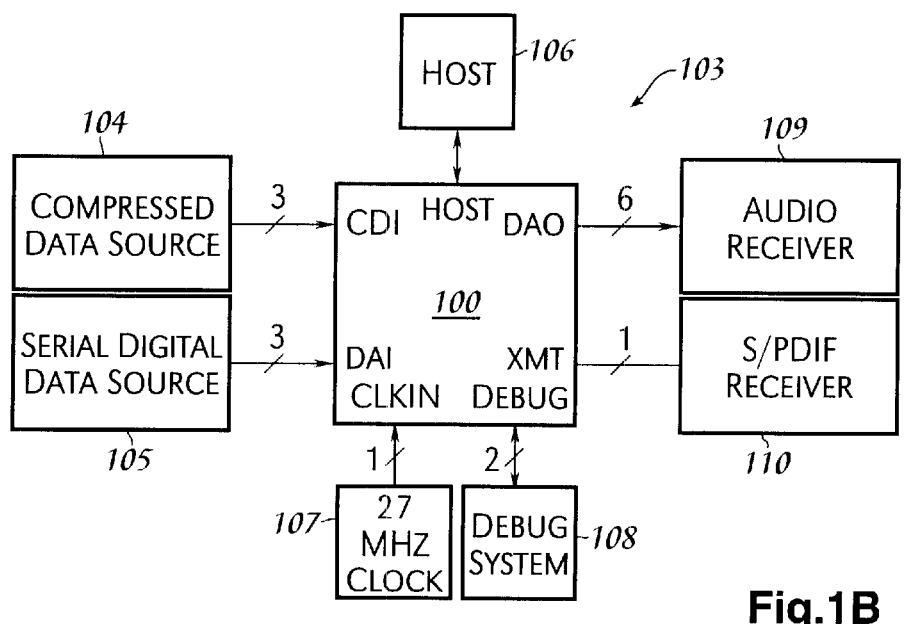
FIG. 1B is a diagram showing the decoder of FIG. 1A in an exemplary system context.

FIG. 1B shows decoder 100 embodied in a representative system 103. Decoder 100 as shown includes three Compressed Data Input (CDI) pins for receiving compressed data from a compressed audio data source 104 and an additional three Digital Audio Input (DAI) pins for receiving serial digital audio data from a digital audio sources 105. Examples of compressed serial digital audio source 105, and in particular of AAC compressed digital sources, are satellite and terrestrial digital TV and radio broadcasting and internet.

The HOST port allows coupling to a host processor 106, which is generally a microcontroller or microprocessor that maintains control over the audio system 103. For instance, in one embodiment, host processor 106 is the microprocessor in a Personal Computer ("PC") and System 103 is a PC-based sound system. In another embodiment, host processor 106 is a microcontroller in an audio receiver or controller unit and system 103 is a non-PC-based entertainment system, such as conventional home entertainment systems produced by Sony, Pioneer, and others. A master clock, shown here, is generated externally by clock source 107. The DEBUG port consists of two lines for connection with an external debugger, which is typically a PC-based device.

Decoder 100 has six output lines for outputting multichannel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to a S/PDIF receiver 110. These outputs may be coupled, for example, to digital to analog converters or codes for transmission to analog receiver circuitry.

Figure 1C:
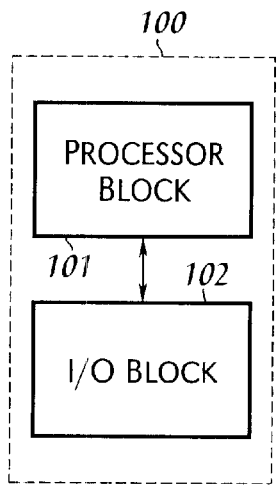
FIG. 1C is a diagram showing the partitioning of the decoder into a processor block in an input/output (I/O) block.

FIG. 1C is a high level functional block diagram of a multichannel audio decoder 100 embodying the principles of the present invention. Decoder 100 is divided into two major sections, a Processor Block 101 and the I/O Block 102. Processor Block 106 includes two digital signal processor (DSP) cores, DSP memory, and system reset control. I/O Block 102 includes interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
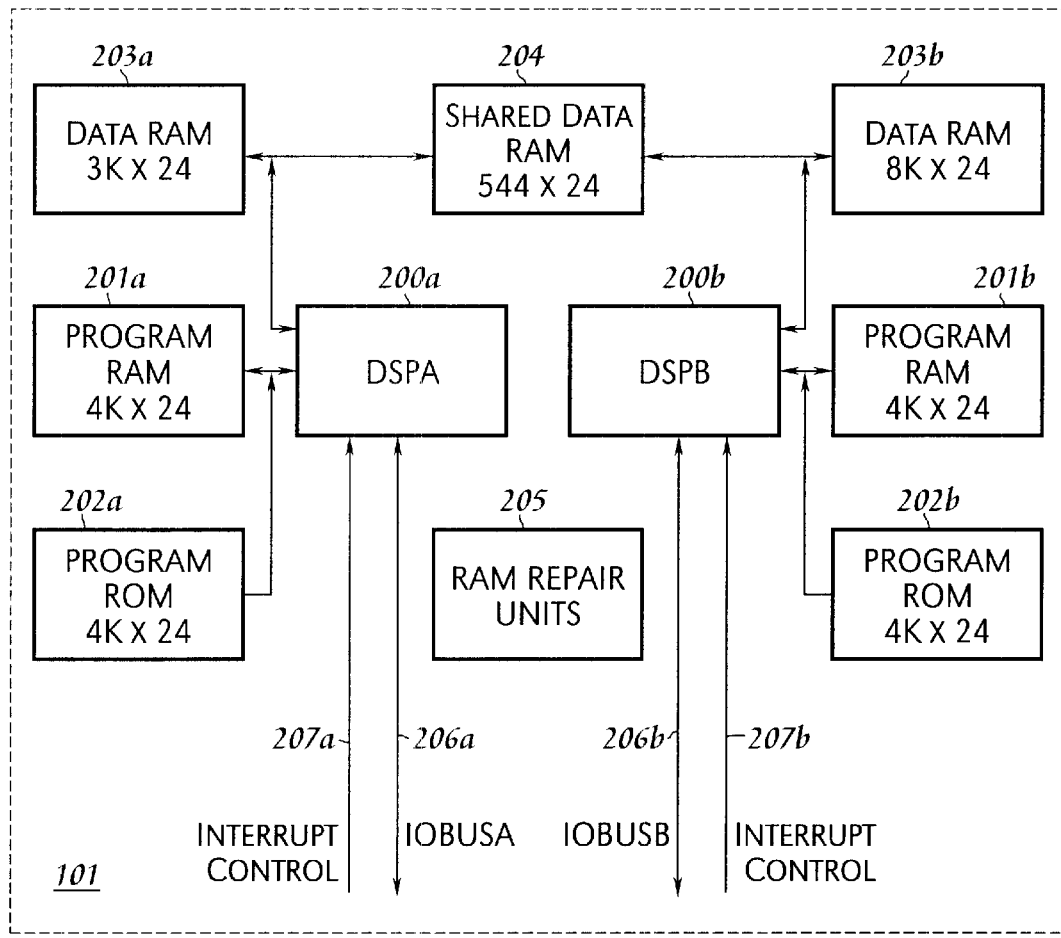
FIG. 2 is a diagram of the processor block of FIG. 1C.

FIG. 2 is a detailed functional block diagram of processor block 101. Processor block 101 includes two DSP cores 200a and 200b, labeled DSPA and DSPB respectively. Cores 200a and 200b operate in conjunction with respective dedicated program RAM 201a and 201b, program ROM 202a and 202b, and data RAM 203a and 203b. Shared data RAM 204, which the DSPs 200a and 200b can both access, provides for the exchange of data, such as PCM data and processing coefficients, between processors 200a and 200b. Processor block 101 also contains a RAM repair unit 205 that can repair a predetermined number of RAM locations within the on-chip RAM arrays to increase die yield.

DSP cores 200a and 200b respectively communicate with the peripherals through I/O Block 102 via their respective I/O buses 206a, 206b. The peripherals send interrupt and flag information back to the processor block via interrupt interfaces 207a, 207b.

Figure 3:
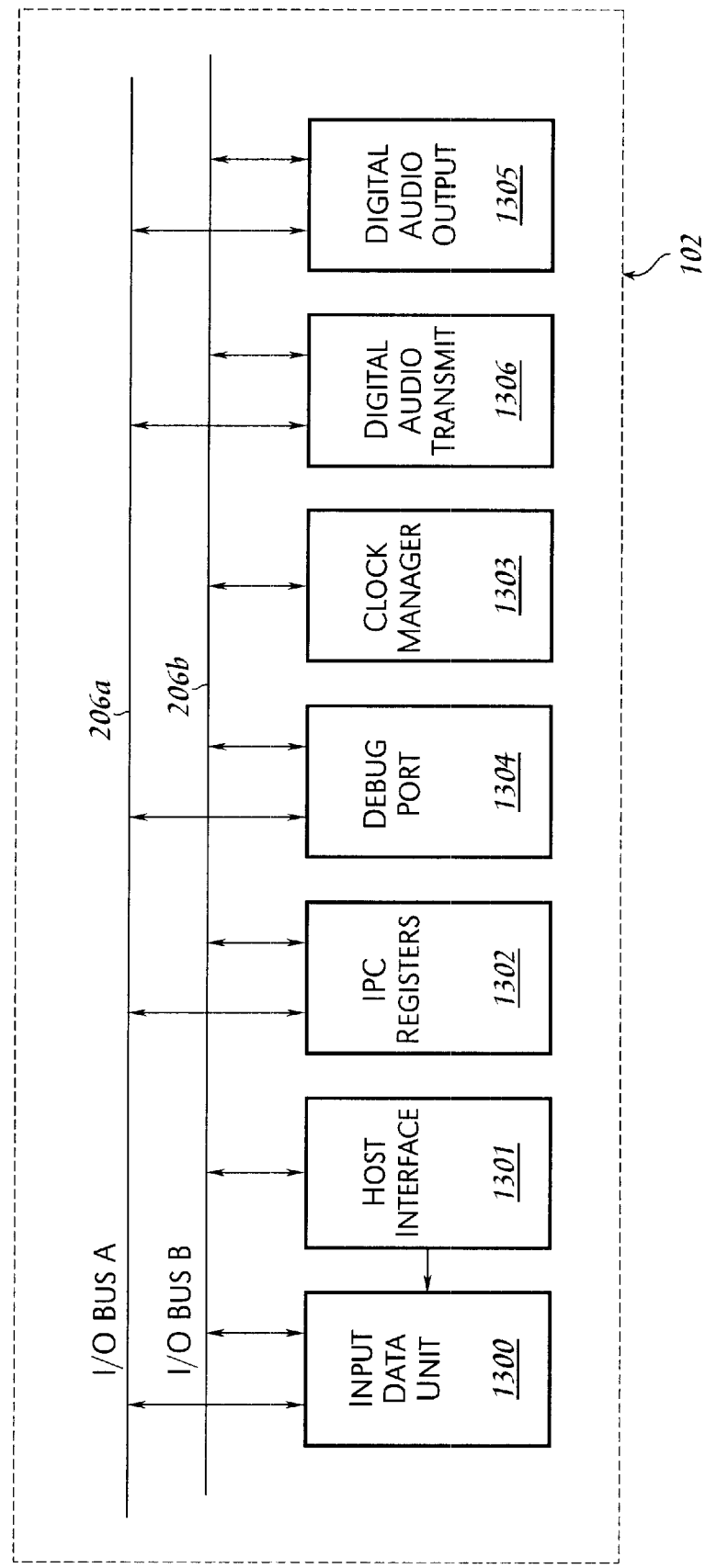
FIG. 3 is a diagram of the primary functional subblocks of the I/O block of FIG. 1C.

FIG. 3 is a detailed functional block diagram of I/O block 102. Generally, I/O block 102 contains peripherals for data input, data output, communications, and control. Input Data Unit 1300 accepts either compressed analog data or digital audio in any one of several input formats (from either the CDI or DAI ports). Serial/parallel host interface 1301 allows an external controller to communicate with decoder 100 through the HOST port. Data received at the host interface port 1301 can also be routed to input data unit 1300.

IPC (Inter-processor Communication) registers 1302 support a control-messaging protocol for communication between processing cores 200 over a relatively low-bandwidth communication channel. High-bandwidth data can be passed between cores 200 via shared memory 204 in processor block 101.

Clock manager 1303 is a programmable PLL/clock synthesizer that generates common audio clock rates from any selected one of a number of common input clock rates through the CLKIN port. Clock manager 1303 includes an STC counter which generates time information used by processor block 101 for managing playback and synchronization tasks. Clock manager 1303 also includes a programmable timer to generate periodic interrupts to processor block 101.

Debug circuitry 1304 is provided to assist in applications development and system debug using an external DEBUGGER and the DEBUG port, as well as providing a mechanism to monitor system functions during device operation.

A Digital Audio Output port 1305 provides multichannel digital audio output in selected standard digital audio formats. A Digital Audio Transmitter 1306 provides digital audio output in formats compatible with S/PDIF or AES/EBU.

In general, I/O registers are visible on both I/O buses, allowing access by either DSPA (200*a*) or DSPB (200*b*). Any read or write conflicts are resolved by treating DSPB as the master and ignoring DSPA.

In the discussion below, the AAC decoding approach is discussed for understanding the utility and advantages of the concepts claimed below. It would be appreciated by one of ordinary skill in the art that the actual claims, however, will determine the scope of the applicants' invention, and that the principles of the present invention may be applied to other encoding schemes.

The AAC approach provides a number of useful functions. For example, the AAC approach provides for a speed change functionality, which allows the change of the time scale without altering the pitch during the decoding process. This approach can, for example, be used to implement a "fast forward" function (data base search) or to adapt the length of an audio sequence to a given video sequence. A pitch change functionality allows the change of the pitch without altering the time scale during the encoding or decoding process. This can be used for example for voice alteration or Karaoke-type applications. Bit rate scalability allows a bitstream to be parsed into a bitstream of lower bit rate, such that the combination can still be decoded into a meaningful signal. The bitstream parsing can occur either during transmission or in the decoder. Bandwidth scalability is a particular case of bitrate scalability, whereby part of a bitstream representing a part of the frequency spectrum can be discarded during transmission or decoding. Encoder complexity scalability allows encoders of different complexity to generate valid and meaningful bitstreams. Decoder complexity scalability allows a given bitstream to be decoded by decoders of different levels of complexity. The audio quality, in general, is related to the complexity of the encoder and decoder used. Error robustness provides the ability for a decoder to avoid or conceal audible distortion caused by transmission errors.

The AAC encoded signals are reconstructed into PCM samples, which are temporarily stored in PCM buffers, and sent to output FIFOs for playback. Given the dynamics of the AAC decode and the available MIPS, the PCM buffers and the output FIFOs have to be designed properly. The output FIFOs act as Direct Memory Access ("DMA") engines, feeding decompressed audio data to Digital-to-Analog Converters ("DACs"), and are designed at the hardware level, while the PCM buffers are the PCM sample reserves created in software to smooth out the data delivery-decode-playback dynamics. Preferably, the output FIFOs are chosen to be a 32-sample (24-bit) size.

Figure 4:
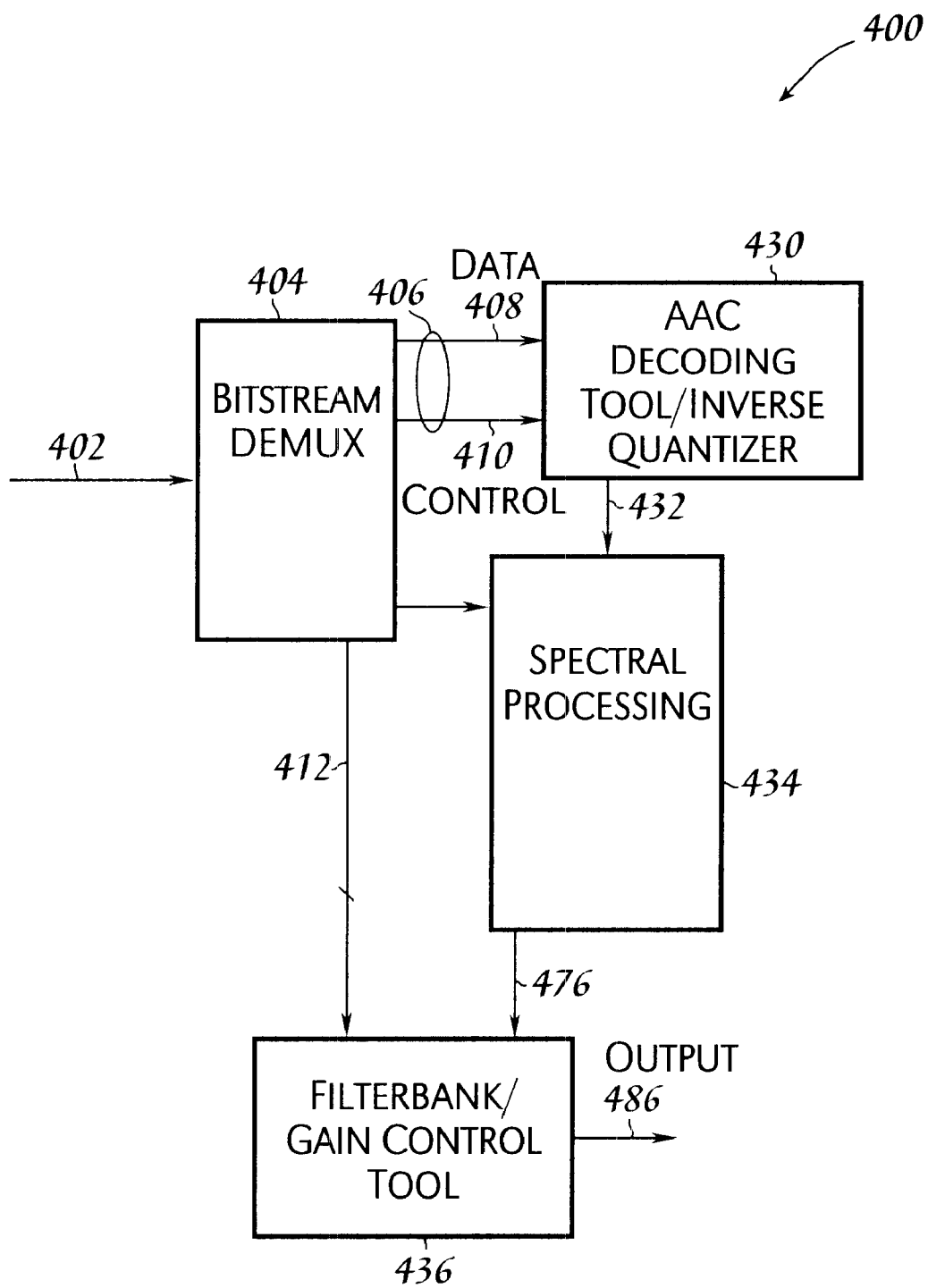
FIG. 4 is a high level block diagram of a decoding architecture in accordance with the principles of the present invention.

A high level block diagram of a coding/decoding architecture is shown in FIG. 4. The functions of the decoder are to find the description of the quantized audio spectra in the bitstream, decode the quantized values and other reconstruction information, reconstruct the quantized spectra, process the reconstructed spectra through whatever tools are active in the bitstream in order to arrive at the actual signal spectra as described by the input bitstream, and finally convert the frequency domain spectra to the time domain, with or without an optional gain control tool. Following the initial reconstruction and scaling of the spectrum reconstruction, other circuitry can be used to modify one or more of the spectra in order to provide more efficient coding. Preferably for these additional circuits, there is maintained an option to "pass through" the data without spectral modification.

Bitstream 402 is input to bitstream demultiplexer (DEMUX) tool 404. Bitstream 402 may be an MPEG-2 AAC bitstream. The demultiplexer separates the bitstream into the parts for each tool, and provides each of the tools with the bitstream information related to that tool.

The output from the bitstream demultiplexer tool 404 may include the quantized (and preferably noiselessly coded) spectra represented by: (1) the sectioning information and the noiselessly coded spectra 406 (AAC) (including data 408 and control information 410); (other such information, for example, Bit-Sliced Arithmetic Coding ("BSAC") information or a set of indices of code vectors (TwinVQ) may also be provided, but are not shown in FIG. 4, for simplicity) and (2) the filterbank and gain control information 41 (Other control information may also be provided, but are not shown in FIG. 4, for simplicity. A detailed discussion of these may be found in the commonly owned, co-pending U.S. patent application Ser. No. 09/771,103 entitled "PCM BUFFERING SYSTEM AND METHOD," which is hereby incorporated herein by reference.

The AAC noiseless decoding tool 430 takes information from the bitstream demultiplexer 400, parses that information, decodes the Huffman coded data, and reconstructs the quantized spectra and the Huffman and differentially coded scalefactors. The AAC specification defines twelve Huffman codebooks, eleven of which may be used to encode the quantized spectra (hereinbelow denoted HCB_1–HCB-11) and the twelfth (hereinbelow denoted HCB_SF) used to encode the scalefactors. The codebook descriptor corresponding to codebook used to encode the data is provided to AAC noiseless decoding tool 430 by bitstream demultiplexer 404 in the sectioning information and the noiselessly coded spectra 406.

The inputs to the noiseless decoding/inverse quantizer tool 430 are the sectioning information for the noiselessly coded spectra 404. The outputs of the noiseless decoding tool are the decoded integer representation of the scalefactors and the quantized values for the spectra 432.

The inverse quantizer tool portion of takes the quantized values for the spectra, which were generated by the AAC noiseless decoding portion of tool 430, and converts the integer values to non-scaled, reconstructed spectra. This quantizer is a non-uniform quantizer. The input to the Inverse Quantizer tool is the quantized values for the spectra and the output of the inverse quantizer tool is the unscaled, inversely quantized spectra. The scalefactor tool converts the integer representation of the scalefactors to the actual values, and multiplies the un-scaled inversely quantized spectra by the relevant scalefactors. The inputs to the scalefactors tool are the decoded integer representation of the scalefactors and the unscaled, inversely quantized spectra. The output from the scalefactors tool is the scaled, inversely quantized spectra. These are provided as spectra 432 to spectral processing tool 434.

Spectral processing tool 434 performs noise and other signal processing on the spectra 432, including the inversion of processing performed at the encoder. Spectral processing tool 434 receives control information 436 from bitstream demultiplexer 402. A description of the signal processing performed by spectral processing tool 434 may be found in the commonly owned, co-pending U.S. patent application Ser. No. 09/771,103 entitled "PCM BUFFERING SYSTEM AND METHOD," which has been incorporated herein by reference.

The filterbank/gain control tool 485 applies the inverse of the frequency mapping that was carried out in the encoder, as indicated by the filterbank/gain control information 412 and the presence or absence of gain control information. An IMDCT may be used for the filterbank tool. If the gain control tool is not used, the IMDCT in the standard AAC mode input may consist of either 1024 or 128 spectral coefficients, depending on the value of window_sequence. If the gain control tool is used, the filterbank tool may be configured to use four sets of either 256 or 32 coefficients, depending on the value of window_sequence.

The inputs to the filterbank tool are the inversely quantized spectra 476 and the filterbank/gain control information 412. The output(s) from the filterbank tool is (are) the time domain reconstructed audio signal(s) 486. The filterbank tool may be constructed from different configurations: a) 1024 or 128 shift-length-type with the option to select two window shapes (AAC); b) 4×switchable 256 or 32 shift-length-type with the option to select two window shapes (AAC); c) 2048 or 512 or 128 shift-length-type with a sine window as defined for TwinVQ; and d) 960 or 120 shift-length-type with the option to select two window shapes (AAC-derived).

The gain control tool (which may be omitted in an alternative embodiment of decoding architecture 400) applies a separate time domain gain control to each of four frequency bands that have been created by the gain control PQF filterbank in the encoder. Then, it assembles the four frequency bands and reconstructs the time waveform through the gain control tool's filterbank.

The inputs to the gain control tool are the time domain reconstructed audio signal(s) and the gain control information. The output from the gain control tool is the time domain reconstructed audio signal(s). If the gain control tool is not active, the time domain reconstructed audio signal(s) are passed directly from the filterbank tool to the output of the decoder. This tool is used for the Scaleable Sampling Rate ("SSR") profile only.

The above audio coding/decoding tools are used, for example, in the AAC architecture specification which is set out in the ISO/EEC CD 14496-3 Subpart 4 Standard, entitled "Information Technology—Coding of Audiovisual Objects; Part 3: Audio; Subpart 4: Time/Frequency Coding, dated May 15, 1998 which is incorporated by reference herein.

AAC algorithms use large and very flexible filterbanks to perform the time and frequency representation of the signal. For example, both 128- and 1024-sample windows are utilized in AAC's filterbank. The 128-sample windows (short windows) are preferably used to capture transients, while the 1024-sample windows (long windows) are preferably utilized to achieve high compression ratios and good frequency resolution for stationary signals. Furthermore, transitions from long to short (and vice versa) windows are supported.

For a complete description of exemplary decoder 100 and its advantages, reference is now made to coassigned U.S. Pat. No. 6,081,783 entitled "DIGITAL AUDIO DECODING CIRCUITRY, METHODS AND SYSTEMS".

Those of ordinary skill in the art will understand that the steps of the processes to be described need not necessarily be executed sequentially, and thus, the flow charts provided herein are not indicative of the serialization of operations being performed in one embodiment of the present invention. Many of the steps disclosed within these flow charts may actually be performed in parallel. The flow chart is only meant to designate those considerations that must be performed to produce the operations described.

Refer now to FIG. 5 illustrating in flow chart form, a "hybrid" decode process 500 to decode an encoded audio bitstream, that is, a bitstream that constitutes a stream of code words representing an audio or other signal source. (Process 500 may be performed by decoder 100, FIGS. 1A–1C.) In step 502, the coding scheme used for encoding the bitstream is determined. Recall, as previously described, in AAC, for example, the algorithms are adaptive, and the encoding of the bitstream may be dynamically changed. In AAC, the encoder can select from one of twelve Huffman codebooks. As described above, the bitstream itself may include control data that contains, among other things, information that specifies the encoding scheme, or codebook, used to encode the data bitstream (that is, a code descriptor). Furthermore, because the encoder may change the coding scheme dynamically, the control information may change. Thus, it would be understood by those of ordinary skill in the art that the decoder, such as decoder 414, FIG. 4, may continually perform process 500.

In step 504, a decode scheme is selected. Several techniques may be used for decoding a variable-length encoding scheme such as Huffman encoding. (For notational simplicity, all codebooks associated with variable length encodings will be denoted HCBs.) This may be generically classified as table lookup, binary search and linear search techniques. Each of these have tradeoffs in terms of MIPS and storage requirements. Moreover, the tradeoff between MIPS and storage requirements may depend on the particular codebook defining the encoding scheme. In other words, one decoding technique, say binary search, may be more "efficient" in terms of the tradeoff between the MIPS requirements and storage requirements while another scheme, table lookup, for example, may be more efficient in terms of the tradeoff between MIPS requirements and storage requirements for a different encoding scheme. Thus, in step 504, depending on the codebook being used, a decoding scheme is selected. This will be discussed in further detail, in conjunction with steps 506–516.

For a bitstream that may be selectively encoded using a multiplicity of codebooks, the predetermined set of codebooks may be partitioned into subsets for which a selected decoding process is to be used. The subsets may be selected in accordance with selection criteria that weigh storage requirements and MIPS requirements. For example, in an embodiment in which the bitstream is an AAC encoded bitstream, the twelve Huffman codebooks may be subdivided into two sets. A first set includes HCB_1–HCB_9 and HCB_SF. A second set includes HCB_10 and HCB_11. However, it would be understood by artisans of ordinary skill that for other digital encoding schemes that use a multiplicity of codebooks, other partitions of the set of codebooks may be selected, depending on the corresponding relative performances of the decoding technique. Such embodiments would fall within the spirit and scope of the present invention.)

Step 506 is an four multiple decision block in which the partition of the set of codebooks includes four subsets. (For example, in a C programming language implementation, step 506 may be a switch statement.) In general, step 506 may be a k-way decision block in an embodiment in which the set of codebooks is partitioned into k subsets, and those of ordinary skill would appreciate that such embodiments fall within the spirit and scope of the present invention. Step 506 includes substeps 506a–506c.

If, in step 506a, the coding scheme used by the decoder to encode the bitstream is within the first subset of HCBs, a two-table decode may be used to decode each code word in the bitstream, step 508. (A two-table lookup methodology in accordance with the present inventive principles which may be used in conjunction with process 500 will be described hereinbelow in conjunction with FIG. 7.)

Otherwise, in step 506b, it is determined if the coding scheme used to encode the bitstream is within the second subset of HCBs. If so, in step 510 a binary search process may be used decode the bitstream. (A binary search methodology which may be used in conjunction with process 500 will be described hereinbelow in conjunction with FIG. 6.)

If the codebook, in not in either the first or second subsets, in step 506c, it is determined if the codebook is in the third subset of HCBs. If so, in step 512, a linear search decode process may be used to decode the bitstream. (A linear search methodology which may be used in conjunction with process 500 will be described hereinbelow in conjunction with FIG. 12.)

If the codebook in not in either the first, second or third subsets, process 500 may use a single table lookup to decode the bitstream, encoded using an HCB in the fourth subset in accordance with the exemplary embodiment in FIG. 5. (A single table lookup methodology which may be used in conjunction with process 500 will be described hereinbelow in conjunction with FIG. 13.) It would be recognized by those of ordinary skill that other decoding processes that may be employed with particular variable-bit encoding schemes may be incorporated in process 500, and such alternative embodiments would be within the spirit and scope of the present invention.

Methodologies for performing a binary search, two table lookup, linear search and single table lookup which may be used in conjunction with the hybrid decode process of FIG. 5 will now be described.

Figure 6:
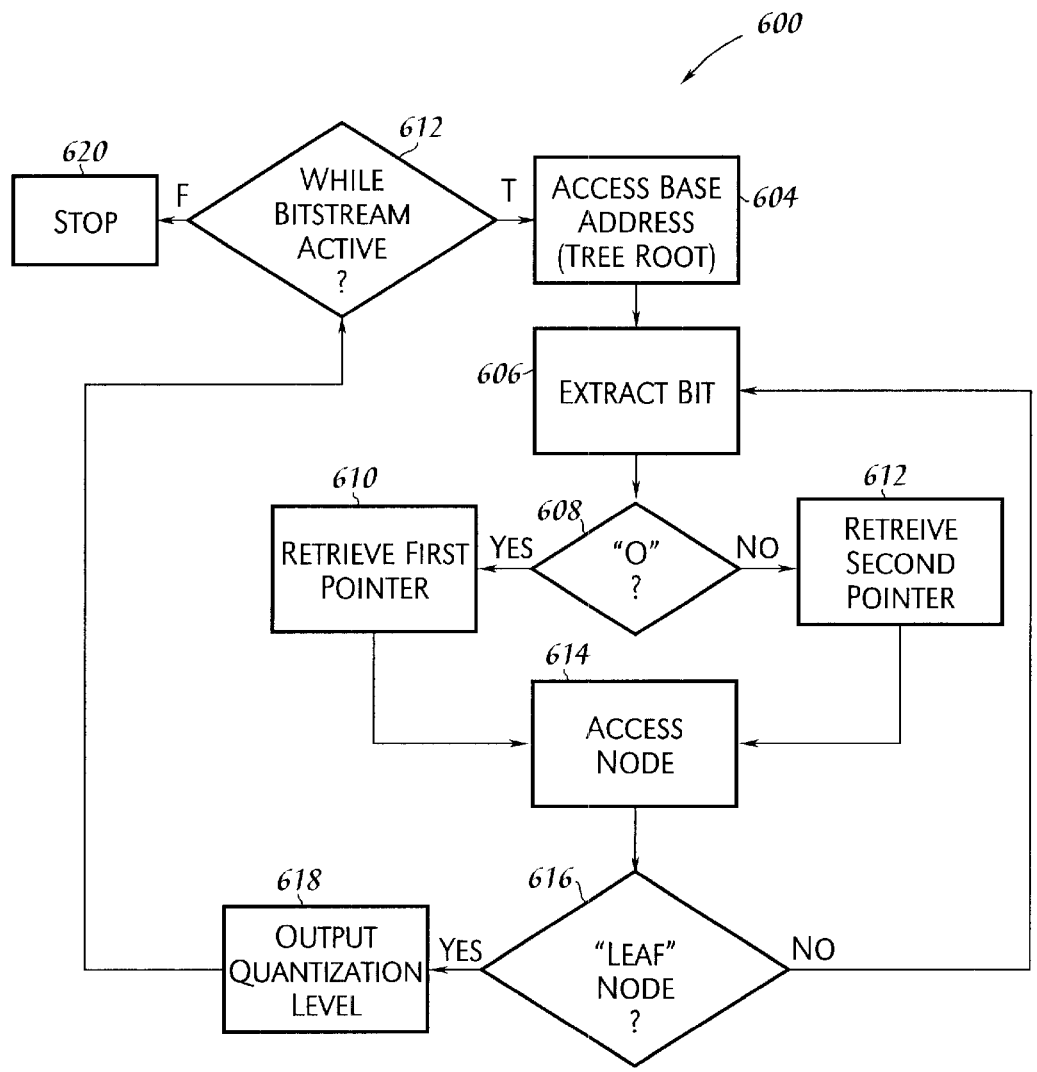
FIG. 6 illustrates a flow chart of an embodiment of process for decoding compressed data values used with the methodology of FIG. 5.

Referring now to FIG. 6, a methodology 600 for performing a binary tree search is illustrated in flow chart form. While the bitstream is active, step 602, process 600 access the codebook (stored as a binary tree) at the base address (which corresponds to the tree "root"), step 604.

In step 606, a bit is extracted from the stream, step 604. If, in step 608, the bit has a first value, here taken to be "zero", a first pointer is retrieved from current node, step 610, otherwise, if the bit has the complementary value, ("one," in this case), a second pointer is retrieved from the current node, step 612.

In step 614, the node pointed to by the retrieved pointer is accessed. If, in step 616, the node is a leaf node (for example, a predetermined bit may be set in a storage register to tag a leaf node), a complete code word has been extracted from the bitstream, and the corresponding quantization level is output from the binary tree, step 618, and process 600 returns to step 602 to continue decoding the bitstream, or terminate, step 620, if the bitstream is inactive.

Returning to step 616, if the node accessed in step 614 is not a leaf node, the process loops back to step 606 and extracts the next bit in the bitstream. Decoding of the codeword continues via steps 608–618, as described above.

Figure 12:
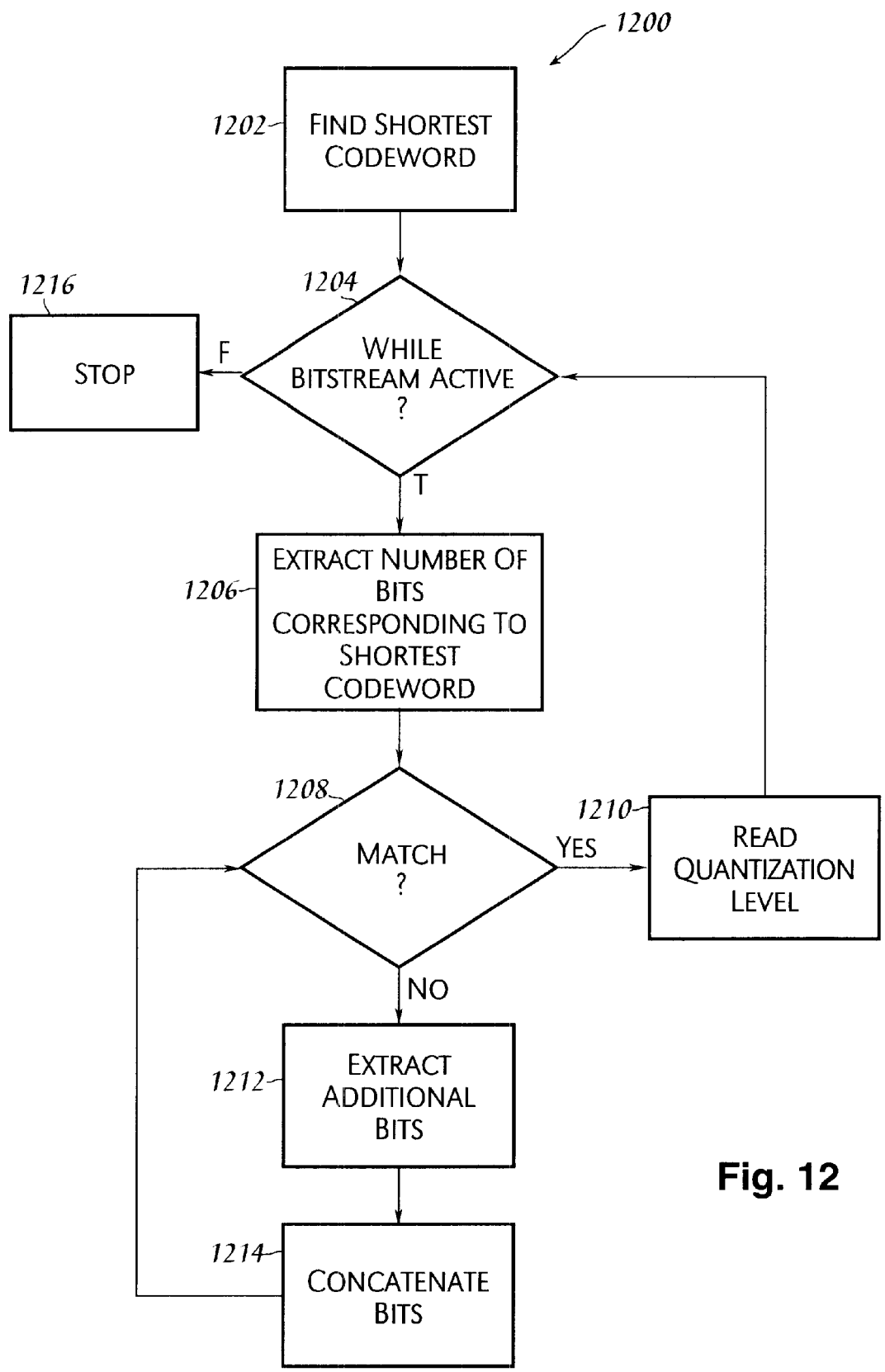
FIG. 12 illustrates, another alternative embodiment of a process for decoding compressed data values used with the methodology of FIG. 5.

A process 1200 for performing a linear search decode is illustrated in FIG. 12. In an embodiment of the present invention using process 1200, the codebook may be stored in increasing order of length of the code words contained therein. In step 1202, the shortest code word for the codebook used to encode the bitstream is found. While the bitstream is active, step 1204, a number of bits corresponding to the length of the shortest code word is extracted from the bitstream, step 1206.

In step 1208, it is determined if the extracted bits match a code word in the codebook. (It would be understood by persons of ordinary skill in the art, that, in step 1208, all code words of the same length are compared against the extracted bits.) If so, the quantization level is read from the codebook, step 1210 and process 1200 returns to step 1204 to continue decoding the bitstream. Otherwise, in step 1212 an additional number of bits are extracted from the bit stream and concatenated with the bits extracted in step 1214. The number of additional bits may be determined by the increment in length between the code words just compared and the next code word in the codebook.

Process 1200 returns to step 1208, to match the set of bits resulting from the concatenation with the next code words in the codebook. While the bitstream is active, the process decodes bits therein by looping over steps 1206–631214, and terminates, in step 1216, after the entire bitstream has been decoded.

FIG. 13 illustrates single table lookup process 1300. For a codebook having a maximum code word length $L_m$, the table used in conjunction with process 1300 may have $2^L$m entries corresponding to all permutations of $L_m$ bits. While the bitstream is active, step 1302, $L_m$ bits are from the bitstream, in step 1304.

In step 1306, these bits are used to index into the lookup table. The quantization level is read from the table at the corresponding entry, step 1308. The $L_m$ bits drawn from the bitstream may exceed the actual length, L, of the code word being decoded. (Because all code words are necessarily of length $L \leq L_m$, the extracted bits must include at least one code word.) In step 1310, the length, L, of the decoded code word is read from the table entry. An exemplary entry 1350 of the lookup table is illustrated in FIG. 13.1. Field 1352 includes the quantization level, that is, the decoded output value, and field 1354 contains the code word length. (Fields 1352 and 1354 may be packed in a single memory word, in an embodiment of the present invention. For example, if the lookup table is stored in a memory having twenty-four bit words, each of fields 1352 and 1354 may be twelve bits.)

Returning to FIG. 13, if in step 1311, $L<L_m$, in step 1312, the "overdrawn" $L_m$-L bits are returned to the bitstream. Otherwise, step 1312 is bypassed via the "No" branch in step 1311. Process 1300 returns to step 1302 to continue decoding the bitstream, while the bitstream is active, and then terminates, in step 1314.

Figure 7:
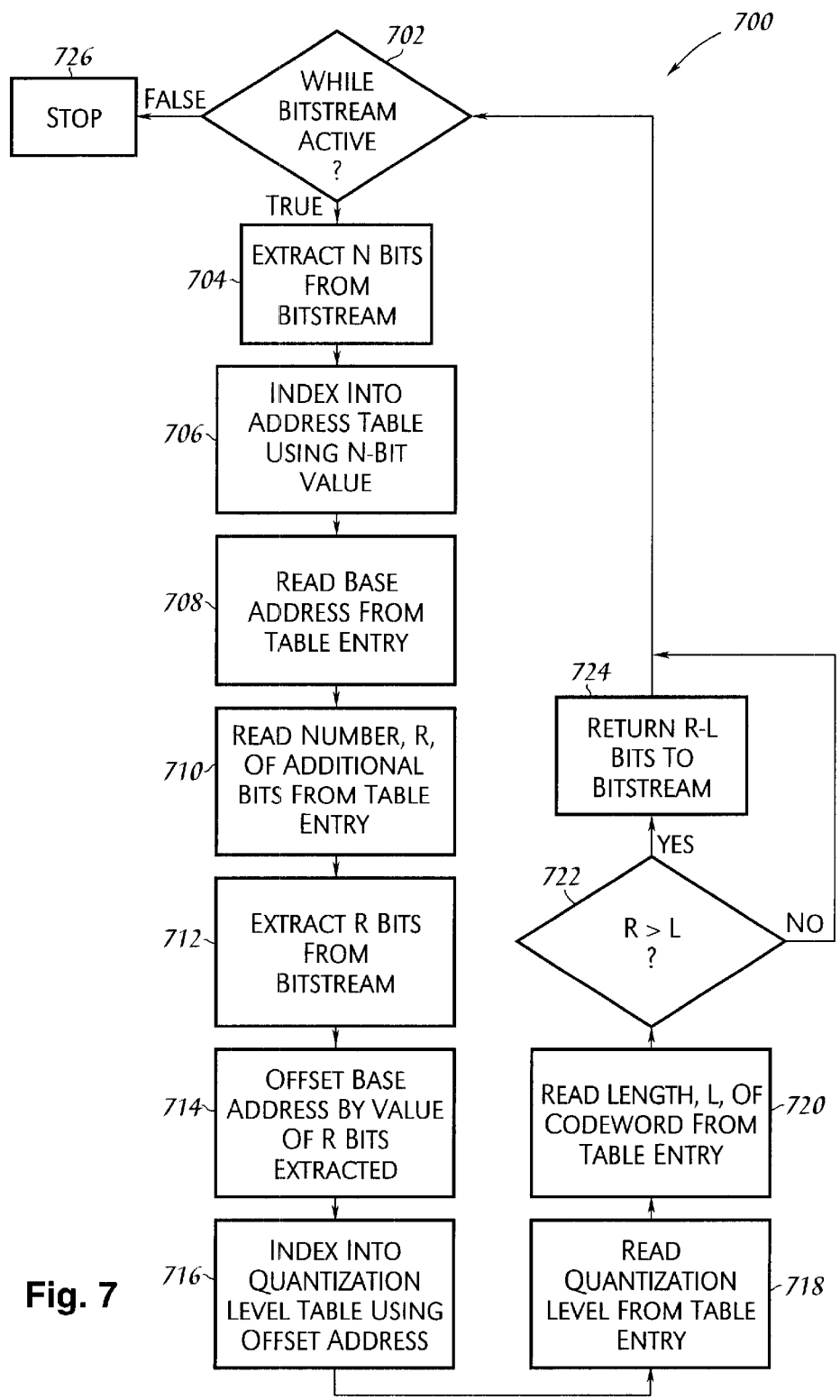
FIGS. 7–7.2 illustrate an alternative embodiment of a process for decoding compressed data values used with the methodology of FIG. 5.

Refer now to FIG. 7 in which is illustrated a process 700 for decoding code words in a bitstream using a two-table lookup methodology in accordance with the principles of the present invention. As described in detail below, process 700 operates in conjunction with two tables, a first decode table (which may also be referred to as the address table) holds data value used to generate an address into the second table (which may be referred to as the quantization level table) which contains the quantization levels (that is, the decoded output values) corresponding to the Huffman encoded code words in the bitstream. An N-bit value drawn from the bitstream is used to index into the address table. The memory requirements to store the tables depend on the length of the lookup index. (This will be discussed further below in conjunction with FIGS. 8–11, describing a methodology for generating the tables.) Additionally, the table length depends on the Huffman codebook used to encode the bitstream. For the purposes of discussion of FIG. 7, a general, N-bit, index may be used.

While the bitstream is active, step 702, N-bit indexes are extracted from the bitstream, step 704.

In step 706 the index is used to index or address, into the first decode table. An exemplary entry 752 of the address table is illustrated in FIG. 7.1. Entry 752 includes a base address field 754 and an additional bits field 756. Note that base address field 754 and additional bits field 756 may be packed in single memory word. For example, if the decode tables are stored in a memory, such as ROM 202a, b, FIG. 2 having twenty-four bit words, field 754 may constitute the upper twelve bits of the memory word and field 756 may constitute the lower twelve bits of the same word. It would be recognized that memory having other numbers of bits may be used in accordance with the principles of the present invention and these would be within the spirit and the scope of the present invention. Returning to FIG. 7, in step 708 the base address (contained in field 754) is read from the table entry pointed to by the index.

In steps 710–714, an address into the second decode table is generated. In step 710, a number of additional bits R, to be drawn from the bitstream as read from the table entry (which may be contained in field 756 of entry 752 in FIG. 7.1). In step 712, R bits (for positive R) are extracted from the bitstream. In step 714, the base address read in step 708 is offset by the value of the R bits extracted from the bitstream in step 712. In other words, the base address is incremented by the value of the R additional bits extracted from the bitstream.

The offset address indexes into the second table, that is the output table, step 716. Each entry of the output table, for example entry 762, FIG. 7.2, may have two fields. A first field, for example, field 764 FIG. 7.2 includes the quantization level, that is, the output value of the code word being decoded. Additionally, a second field, field 766 FIG. 7.2, contains the length of the code word being decoded. Similar to fields 754 and 756 in entry 752 discussed above, fields 764 and 766 may be packed in a single memory word. In step 718 the quantization level is read from the table entry indexed by the offset address, and in step 720 the length of the corresponding code word is read.

If, the number of additional bits drawn in step 712 exceeds the length, L of the code word, step 722, then R-L bits have been "overdrawn." In step 724, the overdrawn bits are returned to the bitstream, and the process returns to step 702 to continue decoding subsequent code words in the bitstream Conversely, if there are no overdrawn bits, step 724 is bypassed and process 700 returns via the "No" branch in step 722 continue decoding the code words in the bitstream. When the bitstream terminates, process 700 ends, step 726.

A process for generating the first and second decode tables will now be described in conjunction with FIGS. 8–11. An artisan of ordinary skill would recognize that the processes to be described may be performed by, for example, a general purpose data processing system, and the resulting tables written to a file. The tables stored on the file may be incorporated in memory associated with the decoder logic, such as program ROM 202a and ROM 202b, FIG. 2.

Figure 8:
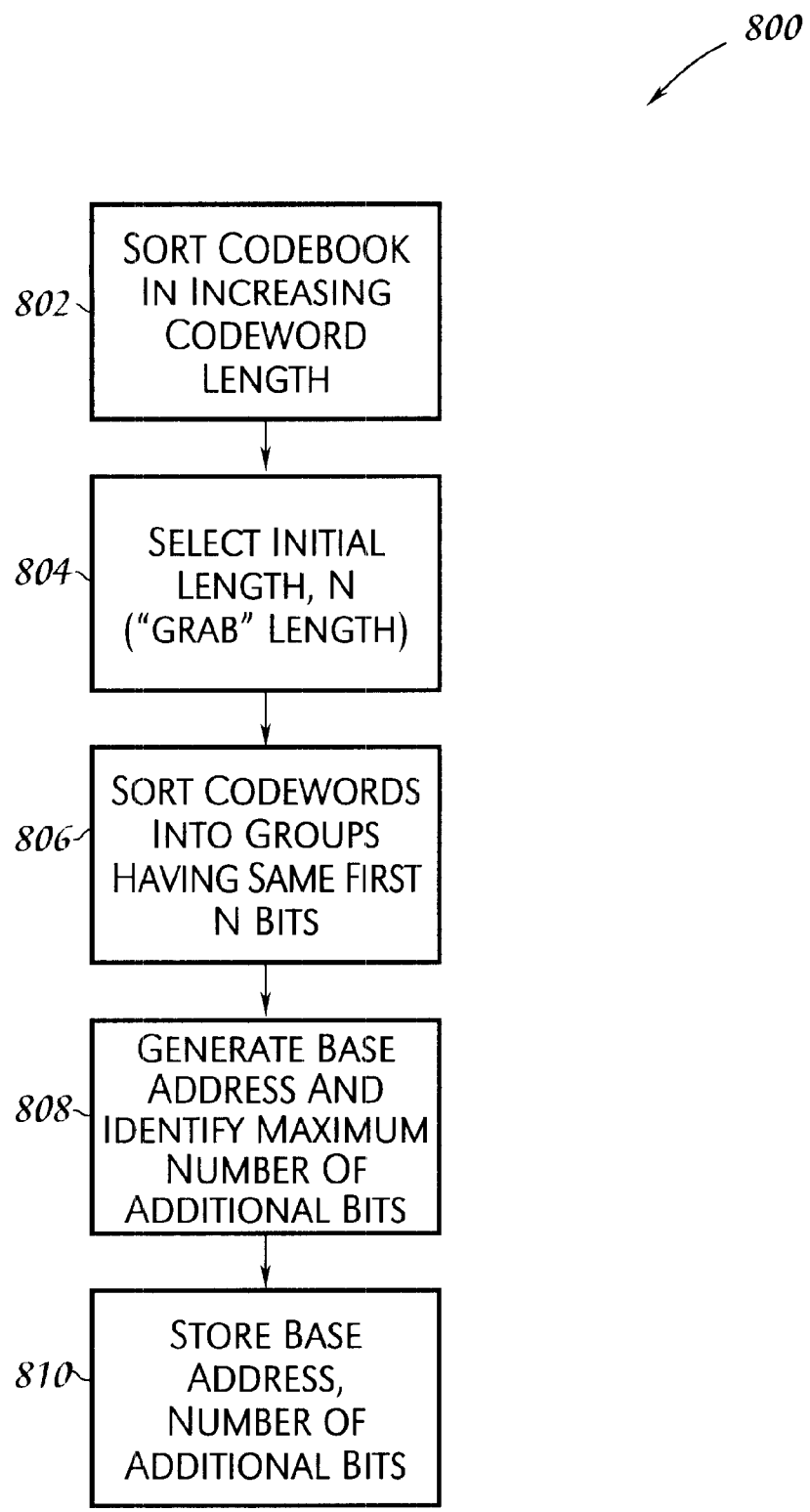
FIG. 8 illustrates, in flow chart form, a process to generate a first table as used with the process of FIG. 7.

FIG. 8, illustrates, in flow chart form, a process illustrated for generating the first table, that is the so-called address table. In step 802, the codebook to be decoded by the tables being generated is sorted in increasing code word length. Table I illustrates an exemplary portion of a codebook after such a sorting, in which code words having lengths between 4 and 7, inclusive, are illustrated:

TABLE I

| code word | code length |
|---|---|
| 0000x | 4 |
| 0001x | 4 |
| 00100 | 5 |
| 00101 | 5 |
| 00110 | 5 |
| 00111 | 5 |
| 01000 | 5 |
| 01001 | 5 |
| 010100 | 6 |
| 010101 | 6 |
| 010110 | 6 |
| 010111 | 6 |
| 011000 | 6 |
| 011001 | 6 |
| 011010 | 6 |
| 0110110 | 7 |
| 0110111 | 7 |
| 0111000 | 7 |
| . | . |
| . | . |
| . | . |

In step 804, an index length, N is selected. (The index length may also be referred to as the "grab" length.) As previously described, the number of entries, and consequently, the amount of storage required to contain a particular decode table pair, depends on the codebook as well as the grab length. (The length of the first decode table is $2^N$. For a given codebook, the sorting of the codebook, in accordance with step 806, FIG. 8, determines the number of groups, for a selected value of the grab length, N. From, the number of additional bits, in accordance with step 906, FIG. 9, the length of the second decode table can be determined as a summation of $2^{|B_i|}$ over the groups. By repeating this process as a function of grab length, N, a value of $N_m$ may be determined for the particular codebook.) For a given codebook, a number $N_m$ corresponding to the decode having the tables smallest memory requirements may be found, empirically. For the twelve Huffman codebooks specified in the AAC specification, memory requirements for storing the first and second decode tables are shown, along with the memory requirements needed to store the binary tree, are shown in Table II, in Appendix A. (In Table II, the storage requirements in words to store the two decode tables are given, assuming most-efficient word packing.)

In step 806, the code words are sorted into groups. In each group, the code word members of the group have the same first N bits. For code words of length less than N, the code word may be left shifted by the difference between N and the code word length. In step 808, a base address is generated for each group, and in step 810 the base address and the number of additional bits are stored in the address table. In a table entry in accordance with entry 752, FIG. 7.1, the base address may be stored in a first field, field 754, and the number of additional bits may be stored in a second field, field 756. Table III illustrates a sorting of the exemplary portion of a codebook shown in Table I.

TABLE III

| Group Number | Codeword | Elements/group | Additional bits (max) |
|---|---|---|---|
| 0 | 0000\|x\| | 1 | −1 |
| 1 | 0001\|x\| | 1 | −1 |
| 2 | 00100\| | 1 | 0 |

TABLE III-continued

| Group Number | Codeword | Elements/group | Additional bits (max) |
|---|---|---|---|
| 3 | 00101\| | 1 | 0 |
| 4 | 00110\| | 1 | 0 |
| 5 | 00111\| | 1 | 0 |
| 6 | 01000\| | 1 | 0 |
| 7 | 01001\| | 1 | 0 |
| 8 | 01010\|0<br>01010\|1 | 2 | 1 |
| 9 | 01011\|0<br>01011\|1 | 2 | 1 |
| 10 | 01100\|0<br>01100\|1 | 2 | 1 |
| 11 | 01101\|0x<br>01101\|10<br>01101\|11 | 3 | 2 |
| 12 | 01110\|00 | — | — |

Figure 9:
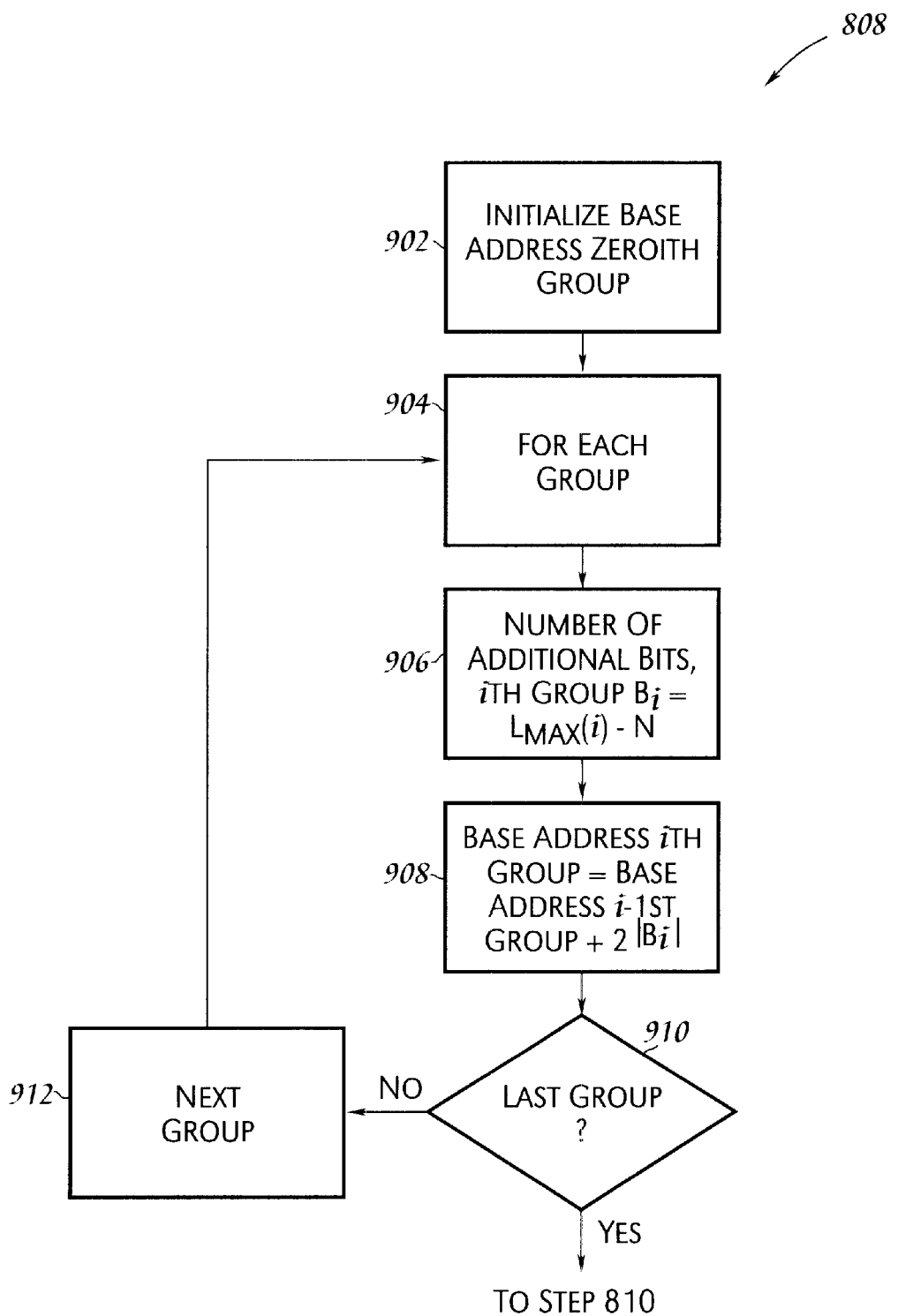
FIG. 9 illustrates, in further detail, a portion of the embodiment of FIG. 8.

Refer now to FIG. 9 illustrating step 808, for generating the base address and determining the number of additional bits for each group. In step 902, the base address for the zeroith group is initialized. This address may be the initial address for the beginning of the second decode table, that is, the quantization level table. The process then loops over groups in steps 904–912.

In step 906, the maximum number of additional bits, $B_i$ for the current, that is the ith group is determined as the difference between the longest code word in the group and the grab length, N.

In step 908, the base address for the current ith, group is determined by adding $2^{|B^i|}$ to the base address of the previous group.

If, in step 910, the base address and number of additional bits for the last group has not been generated the process proceeds to the next group, step 912 and generates the base address and number of additional bits for the next group.

After the base address and number of additional bits have been calculated for all the groups, the process returns to step 810, FIG. 8, via the "Yes" branch in step 910.

Figure 10:
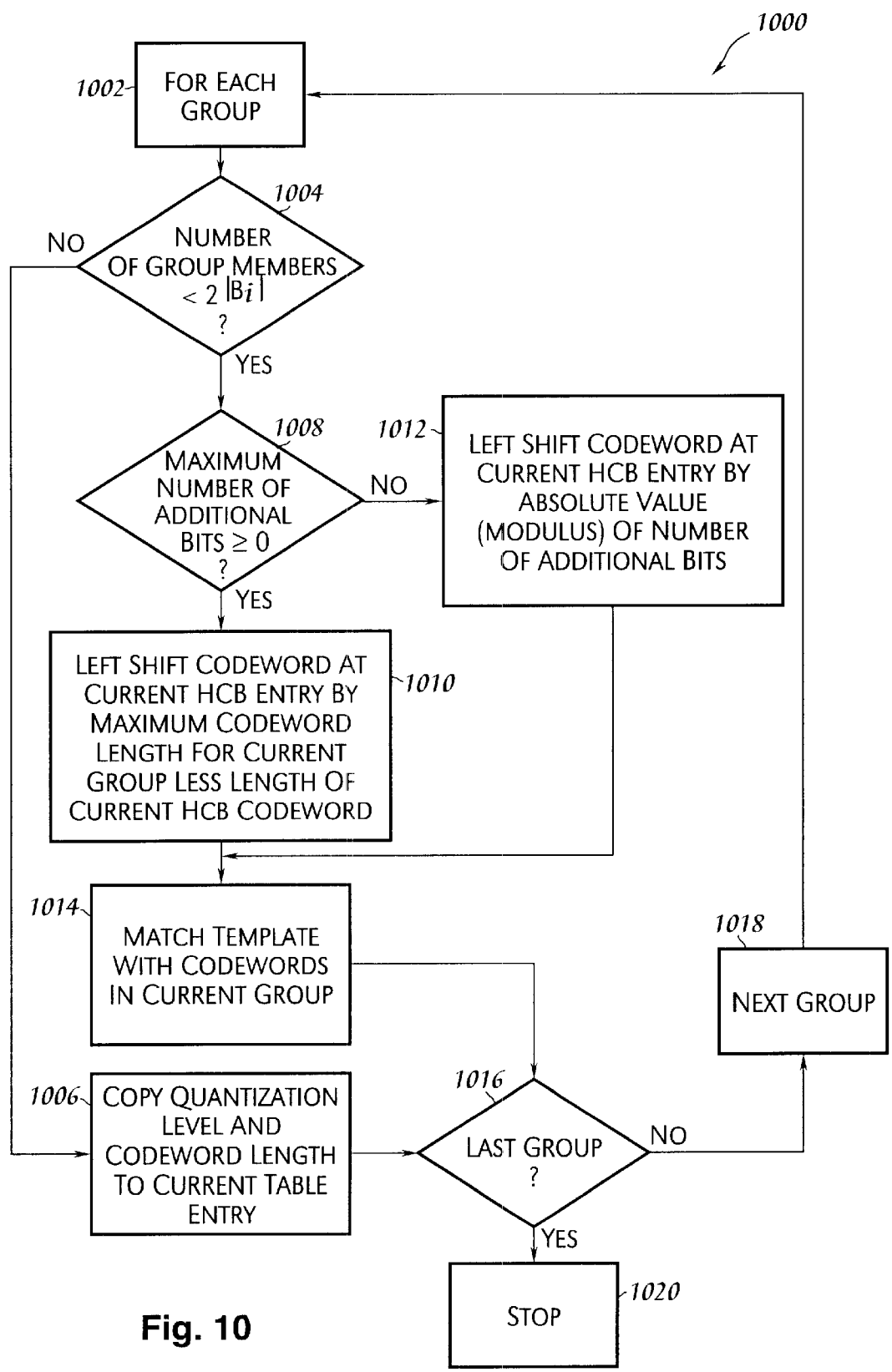
FIG. 10 illustrates, in flow chart form, a process for generating a second table as used with the process of FIG. 7.

FIG. 10 illustrates, in flow chart form, process 1000 for generating the second decode table, storing the quantization levels, in accordance with the principles of the present invention. In step 1002, process 1000 enters a loop over groups, as defined in conjunction with Table 1. Table 2 includes the quantization level, that is, the output value, and the code length, for each code word belonging to each of the groups. For each group, the number of entries in decode Table 2 is given by the summation of $2^{|B^i|}$, where, as before i denotes the running index over groups. Note that this value corresponds to the number of permutations of the additional bits. If, this value exceeds the number of elements in the corresponding group, there is a redundancy, and the second decode table must account for redundancy to allow for all of the possible permutations of the additional bits.

If, there is no redundancy, that is the number of group members is less than $2^{|B^i|}$, in step 1004, process 1000 proceeds to step 1006 and copies into the current entry in the second decode the quantization level and code word length for each group member in the current group. In step 1016 it is determined if the entries in the second decode table have been generated. If not process 1000 proceeds to the next step group, step 1018 and returns to step 1002. Otherwise, process 1000 terminates, step 1020.

If, however, there is redundancy, process 1000 generates a template, in steps 1008–1012, to map code words to decode entries in the second decode table. If the maximum number of additional bits for the current group is zero or positive, step 1008, the template is generated in step 1010. The template is generated by left shifting the code word of the current HCB entry by the difference between the maximum code word length for the current group and the length of the current HCB code word. If, however, in step 1008, the maximum number of additional bits is negative, (in other words, the length of the code word in the group is smaller than the grab length) the template is generated in step 1012. In step 1012, the code word at the current HCB entry is left shifted by the absolute value (or modulus) of the number of additional bits, $B_i$.

In step 1014, the template is matched with the code words in the current group. Step 1014 will be discussed in further detail in conjunction with FIG. 11 below. In step 1006, the quantization level and code word length for the matched code words are copied to the second decode table.

Process 1000 then continues to loop over the groups via steps 1016 and 1018, and after the entries in the second decode table have been generated for all of the groups, terminates in step 1020.

Figure 11:
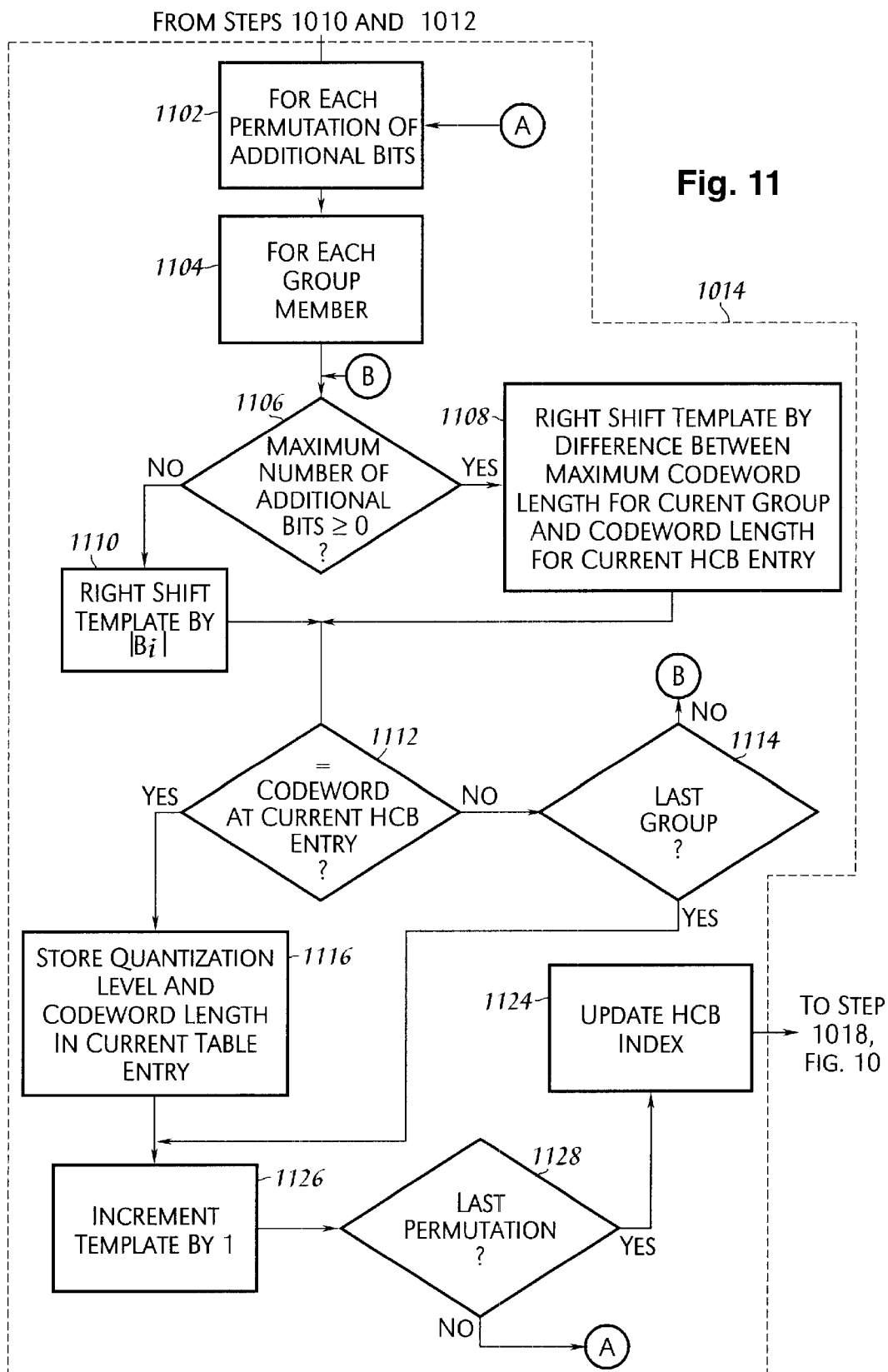
FIG. 11 illustrates, in further detail, a portion of the embodiment of FIG. 10.

Refer now to FIG. 11 illustrating steps 1014, FIG. 10, in further detail. Consider first step 1014, for matching template to codebook entries for all possible permutations of the additional bits for the members of the current group. A loop over each of the permutations of the additional bits is entered in step 1102, and in step 1104, the process enters a loop over the number of members of the current group.

In step 1106, it is determined if the maximum number of additional bits for the current group is nonnegative. If so, the template generated as described in conjunction with steps 1008–1010, FIG. 10 is right shifted by the difference between the maximum code word length for the current group and the code word length for the current HCB entry, step 1108. Otherwise, the template is right shifted by the absolute value of the maximum number of additional bits for the current group, step 1110.

The result is compared, step 1112, with the code word at the current HCB entry. If there's not a match, the process determines if the current group is the last group, step 1114. If not, the process returns to step 1106 to repeat steps 1106–1112 for the next group.

Otherwise, in step 1126, the template is incremented by one. In step 1128, it is determined if all permutations of the additional bits have been matched. If not, step 1006 reenters step 1014 to continue matching. Otherwise, the HCB index is updated, and step 1006 returns to step 1016, FIG. 10, as previously described, to continue generating further entries in the second decode table for the next groups, or terminating, as previously described.

Returning to step 1112, if a comparison between the code word at the current HCB entry, and the right shifted template is found, in step 1116, the quantization level from the HCB entry in code word length are stored in the current decode table entry, for example an entry in accordance with entry 762, FIG. 7.2. The process then continues with step 1126, as previously described.

Exemplary decode tables pairs corresponding to AAC Huffman codebooks HCB_10 and HCB_11 are illustrated in Appendix B. The decode tables for HCB_10 correspond to a grab length, N=6, and the decode tables for HCB_11 correspond to a grab length N=5. (For ease in reading, the table values are indicated as decimal values, however it would be understood that the table may be stored in the decoder memory in binary representation.) As seen in Table II, Appendix A, the memory requirements for these two tables is smaller than the memory requirements to store the binary tree for the corresponding binary search decode scheme.

Although the foregoing has been discussed in conjunction with the Huffman codebooks associated with the DAC, it would be appreciated by those of ordinary skill in the art that systems and methods embodying the present inventive principles would be applied to other variable-length encoding the scheme. Such embodiments would fall within the spirit and scope of the present invention.

As previously described, in accordance with the principles of the present invention discussed in conjunction with FIG. 5, a decoder may use a hybrid decoding process in which the decoding scheme (which may also be referred to as decoding process, decoding technique, a equivalently) is selected in response to the coding scheme, that is, the particular codebook, used to encode the bitstream. A methodology will now be described for auditioning the predetermined side of codebooks which may be used by an encoder to encode the bitstream into subsets associated with a selected decoding scheme for decoding bitstreams encoded using the corresponding codebooks in the subset.

Figure 14:
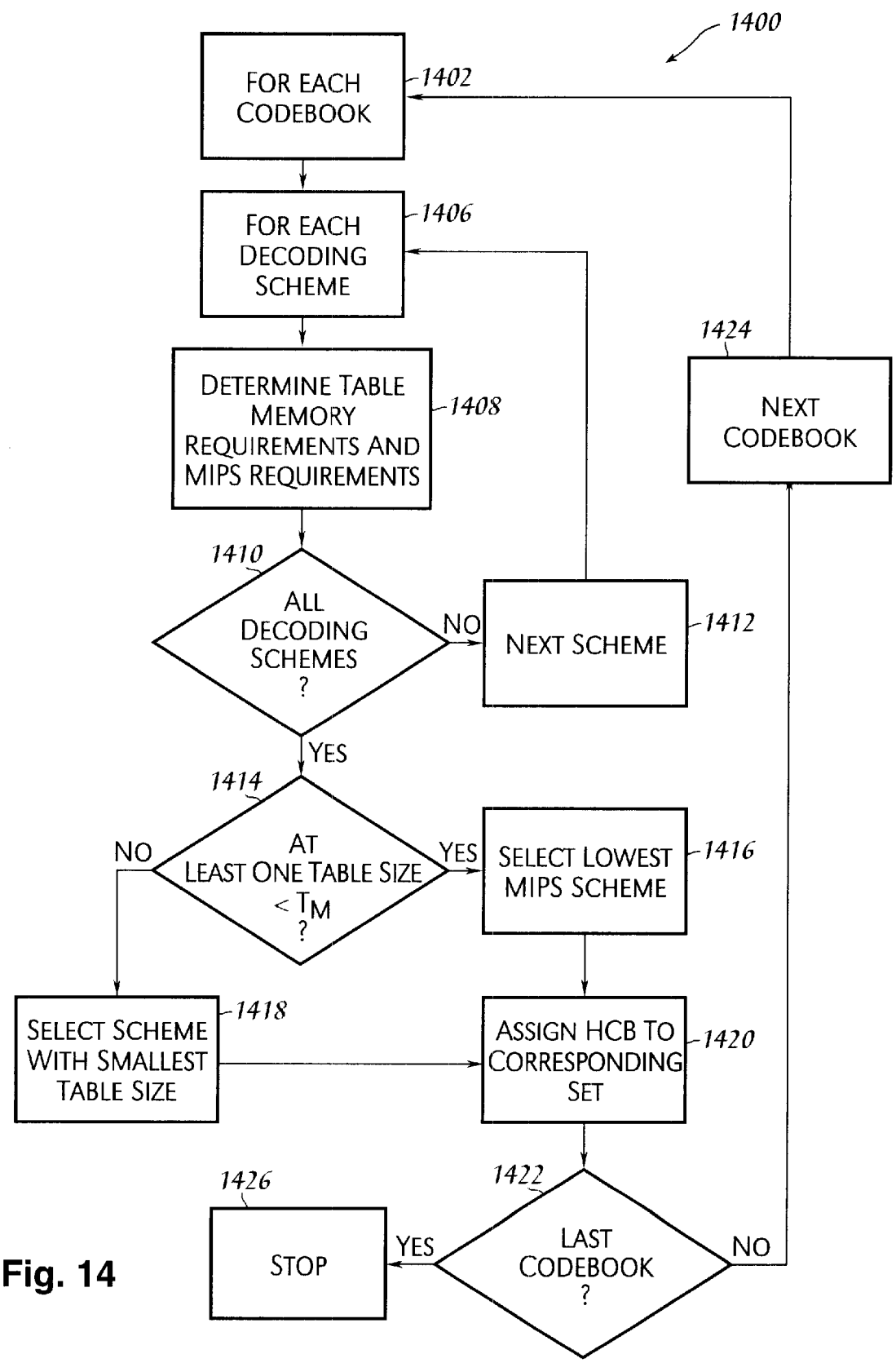
FIG. 14 illustrates, in flow chart from a process for partitioning a predetermined set of codebooks into subsets corresponding to a selected decoding scheme.

Refer now to FIG. 14, illustrating process 1400 for assigning codebooks to subsets corresponding to the selected decoding schemes. For each codebook, step 1402 and for each decoding scheme which may be used, step 1406, it is determined in step 1408 the table memory requirements and the MIPS requirements for the decoding scheme and codebook.

Process 1400 loops over decoding schemes in steps 1410 and 1412, advancing to a next decoding scheme in step 1412 if, in step 1410, all decoding schemes have not been considered. After the table memory requirements and the MIPS requirements have been determined for the all the decoding schemes, process 1400 proceeds by the "Yes" branch in step 1410, and selects in steps 1414–1420, a particular decoding scheme for each codebook and assigns the codebooks to one of the sets corresponding to each of the decoding schemes.

In step 1414, it is determined if at least one scheme has a table size (as determined in step 1408) less than a predetermined threshold table size, $T_m$. If so, in step 1416, the lowest MIPs scheme is selected. Otherwise, in step 1418 the scheme with the smallest table size is selected.

In step 1420, the current codebook is assigned to the set of codebooks corresponding to the scheme selected in step 1416, or step 1418 as appropriate. It would be recognized by artisans of ordinary skill that the selection criteria in steps 1414–1418 of process 1400 is exemplary, and that alternative criteria may be used. For example, the scheme with the smallest table size may always be selected. And yet another alternative, the decoding scheme with the lowest MIPS may be selected. One of ordinary skill would further appreciate that such alternative embodiments of process 1400 would fall within the spirit and scope of the present invention.

In step 1422, it is determined if all codebooks have been assigned to one of the processes, and the associated subset. If not, in step 1424 process 1400 proceeds to the next codebook and returns to 1402. Otherwise, after all codebooks have been assigned, process 1400 terminates in step 1426. It would be recognized by those of ordinary skill that process 1400 may be performed by a special purpose data processing system, or a general purpose data processing system under the control of software containing programming for performing the steps thereof.

Although the present invention and its advantages have been described in detail, it should be understood that various changes, substitutions and alterations can be made herein without departing from the spirit and scope of the invention as defined by the appended claims.

APPENDIX A

| | N = 3 | N = 4 | N = 5 | N = 6 | N = 7 | N = 8 | N = 9 | N = 10 | Optimal N | Binary Search | Two Table Lookup | Selected Method |
|---|---|---|---|---|---|---|---|---|---|---|---|---|
| HCB_1 | — | 184 | 160 | 192 | — | — | — | — | 5 | 81 | 160 | Binary |
| HCB_2 | 121 | 113 | 121 | 164 | — | — | — | — | 4 | 81 | 113 | Binary |
| HCB_3 | — | 4146 | 2136 | 1184 | 795 | 793 | 1171 | — | 8 | 81 | 793 | Binary |
| HCB_4 | — | 312 | 226 | 232 | — | — | — | — | 5 | 81 | 226 | Binary |
| HCB_5 | — | 560 | 344 | 288 | 356 | — | — | — | 6 | 81 | 288 | Binary |
| HCB_6 | — | 193 | 166 | 192 | — | — | — | — | 5 | 81 | 166 | Binary |
| HCB_7 | — | 305 | 218 | 224 | — | — | — | — | 5 | 64 | 218 | Binary |
| HCB_8 | — | 129 | 123 | 166 | — | — | — | — | 5 | 64 | 123 | Binary |
| HCB_9 | — | 2112 | 1142 | 714 | 603 | 748 | — | — | 7 | 169 | 603 | Binary |
| HCB_10 | — | 375 | 292 | 290 | 373 | — | — | — | 6 | 169 | 290 | 2-Step |
| HCB_11 | — | 492 | 408 | 411 | — | — | — | — | 5 | 289 | 408 | 2-Step |
| HCB_SF | — | — | — | — | 4363 | 2571 | 2060 | 2572 | 9 | 121 | 2060 | Binary |

APPENDIX B

DECODE TABLE 1 (HCB_10)

| Entries 1–32 | | Entries 33–64 | |
|---|---|---|---|
| Output | Codeword Length | Output | Codeword Length |
| 0 | −2 | 32 | 0 |
| 0 | −2 | 33 | 0 |
| 0 | −2 | 34 | 0 |
| 0 | −2 | 35 | 0 |
| 4 | −2 | 36 | 0 |
| 4 | −2 | 37 | 0 |
| 4 | −2 | 38 | 0 |
| 4 | −2 | 39 | 0 |
| 8 | −2 | 40 | 0 |
| 8 | −2 | 41 | 0 |
| 8 | −2 | 42 | 1 |
| 8 | −2 | 44 | 1 |
| 12 | −1 | 46 | 1 |
| 12 | −1 | 48 | 1 |
| 14 | −1 | 50 | 1 |
| 14 | −1 | 52 | 1 |
| 16 | −1 | 54 | 1 |
| 16 | −1 | 56 | 1 |
| 18 | −1 | 58 | 2 |
| 18 | −1 | 62 | 2 |
| 20 | −1 | 66 | 2 |
| 20 | −1 | 70 | 2 |
| 22 | −1 | 74 | 2 |
| 22 | −1 | 78 | 2 |
| 24 | −1 | 82 | 3 |

APPENDIX B-continued

DECODE TABLE 1 (HCB_10)

| Entries 1–32 | | Entries 33–64 | |
|---|---|---|---|
| Output | Codeword Length | Output | Codeword Length |
| 24 | −1 | 90 | 3 |
| 26 | −1 | 98 | 3 |
| 26 | −1 | 106 | 3 |
| 28 | 0 | 114 | 4 |
| 29 | 0 | 130 | 4 |
| 30 | 0 | 146 | 4 |
| 31 | 0 | 162 | 6 |

DECODE TABLE 1 (HCB_11)

| Entries 1–32 | |
|---|---|
| Output | Codeword Length |
| 0 | −1 |
| 0 | −1 |
| 2 | −1 |
| 2 | −1 |
| 4 | 0 |
| 5 | 0 |
| 6 | 0 |

DECODE TABLE 2 (HCB_10)

| Entries 1–20 | | Entries 21–40 | | Entries 41–60 | | Entries 61–80 | | Entries 81–100 | | Entries 101–120 | |
|---|---|---|---|---|---|---|---|---|---|---|---|
| Output | Codeword Length | Output | Codeword Length | Output | Codeword Length | Output | Codeword Length | Output | Codeword Length | Output | Codeword Length |
| 14 | 4 | 41 | 5 | 31 | 6 | 83 | 8 | 108 | 8 | 61 | 9 |
| 14 | 4 | 41 | 5 | 67 | 6 | 93 | 8 | 60 | 8 | 132 | 9 |
| 14 | 4 | 40 | 5 | 18 | 7 | 46 | 8 | 72 | 8 | 22 | 9 |
| 14 | 4 | 40 | 5 | 66 | 7 | 33 | 8 | 72 | 8 | 98 | 9 |
| 15 | 4 | 29 | 5 | 68 | 7 | 71 | 8 | 109 | 8 | 111 | 9 |
| 15 | 4 | 29 | 5 | 44 | 7 | 106 | 8 | 109 | 8 | 122 | 9 |
| 15 | 4 | 42 | 5 | 69 | 7 | 94 | 8 | 73 | 8 | 89 | 9 |
| 15 | 4 | 42 | 5 | 57 | 7 | 65 | 8 | 73 | 8 | 133 | 9 |
| 27 | 4 | 26 | 6 | 80 | 7 | 92 | 8 | 97 | 9 | 74 | 9 |
| 27 | 4 | 2 | 6 | 32 | 7 | 5 | 8 | 85 | 9 | 134 | 9 |
| 27 | 4 | 30 | 6 | 81 | 7 | 105 | 8 | 119 | 9 | 36 | 9 |
| 27 | 4 | 54 | 6 | 52 | 7 | 20 | 8 | 78 | 9 | 131 | 9 |
| 28 | 5 | 17 | 6 | 79 | 7 | 107 | 8 | 86 | 9 | 49 | 9 |
| 28 | 5 | 53 | 6 | 4 | 7 | 95 | 8 | 120 | 9 | 123 | 9 |
| 13 | 5 | 0 | 6 | 19 | 7 | 59 | 8 | 48 | 9 | 87 | 9 |
| 13 | 5 | 55 | 6 | 45 | 7 | 34 | 8 | 118 | 9 | 87 | 9 |
| 1 | 5 | 43 | 6 | 70 | 7 | 84 | 8 | 35 | 9 | 104 | 9 |
| 1 | 5 | 39 | 6 | 82 | 7 | 96 | 8 | 6 | 9 | 104 | 9 |
| 16 | 5 | 3 | 6 | 58 | 7 | 21 | 8 | 110 | 9 | 62 | 9 |
| 16 | 5 | 56 | 6 | 58 | 7 | 47 | 8 | 121 | 9 | 62 | 9 |

| Entries 121–140 | | Entries 141–160 | | Entries 161–180 | | Entries 181–200 | | Entries 201–220 | | Entries 221–226 | |
|---|---|---|---|---|---|---|---|---|---|---|---|
| Output | Codeword Length | Output | Codeword Length | Output | Codeword Length | Output | Codeword Length | Output | Codeword Length | Output | Codeword Length |
| 91 | 9 | 101 | 10 | 64 | 10 | 163 | 11 | 140 | 11 | 129 | 12 |
| 91 | 9 | 88 | 10 | 126 | 10 | 163 | 11 | 140 | 11 | 155 | 12 |
| 145 | 9 | 137 | 10 | 162 | 10 | 102 | 11 | 152 | 11 | 167 | 12 |
| 145 | 9 | 63 | 10 | 162 | 10 | 102 | 11 | 152 | 11 | 12 | 12 |
| 100 | 10 | 24 | 10 | 162 | 10 | 77 | 11 | 153 | 11 | 166 | 12 |
| 146 | 10 | 158 | 10 | 162 | 10 | 77 | 11 | 153 | 11 | 168 | 12 |
| 136 | 10 | 125 | 10 | 38 | 10 | 90 | 11 | 11 | 11 | | |
| 23 | 10 | 159 | 10 | 38 | 10 | 90 | 11 | 11 | 11 | | |
| 144 | 10 | 149 | 10 | 38 | 10 | 139 | 11 | 154 | 11 | | |
| 124 | 10 | 76 | 10 | 38 | 10 | 139 | 11 | 154 | 11 | | |
| 7 | 10 | 160 | 10 | 114 | 10 | 115 | 11 | 128 | 11 | | |
| 112 | 10 | 150 | 10 | 114 | 10 | 115 | 11 | 128 | 11 | | |
| 135 | 10 | 161 | 10 | 114 | 10 | 164 | 11 | 141 | 11 | | |
| 50 | 10 | 51 | 10 | 114 | 10 | 164 | 11 | 141 | 11 | | |
| 75 | 10 | 89 | 10 | 127 | 11 | 10 | 11 | 156 | 11 | | |
| 113 | 10 | 117 | 10 | 127 | 11 | 10 | 11 | 156 | 11 | | |
| 148 | 10 | 138 | 10 | 25 | 11 | 103 | 11 | 116 | 11 | | |
| 8 | 10 | 130 | 10 | 25 | 11 | 103 | 11 | 116 | 11 | | |
| 147 | 10 | 157 | 10 | 151 | 11 | 143 | 11 | 165 | 12 | | |
| 37 | 10 | 9 | 10 | 151 | 11 | 143 | 11 | 142 | 12 | | |

DECODE TABLE 1 (HCB_11)

Entries 1–32

| Output | Codeword Length |
|---|---|
| 7 | 0 |
| 8 | 0 |
| 9 | 0 |
| 10 | 1 |
| 12 | 1 |
| 14 | 1 |
| 16 | 2 |
| 20 | 2 |
| 24 | 2 |
| 28 | 2 |
| 32 | 3 |
| 40 | 3 |
| 48 | 3 |
| 56 | 3 |
| 64 | 3 |
| 72 | 3 |
| 80 | 3 |
| 88 | 4 |
| 104 | 4 |
| 120 | 4 |
| 136 | 4 |
| 152 | 5 |
| 184 | 5 |
| 216 | 5 |
| 248 | 7 |

DECODE TABLE 2 (HCB_11)

| Entries 1–32 | | Entries 33–64 | | Entries 65–96 | | Entries 97–128 | | Entries 129–160 | | Entries 161–192 | |
|---|---|---|---|---|---|---|---|---|---|---|---|
| Output | Codeword Length | Output | Codeword Length | Output | Codeword Length | Output | Codeword Length | Output | Codeword Length | Output | Codeword Length |
| 0 | 4 | 56 | 7 | 118 | 8 | 109 | 8 | 172 | 9 | 192 | 9 |
| 0 | 4 | 56 | 7 | 282 | 8 | 109 | 8 | 154 | 9 | 192 | 9 |
| 18 | 4 | 89 | 7 | 122 | 8 | 125 | 8 | 158 | 9 | 191 | 10 |
| 18 | 4 | 89 | 7 | 120 | 8 | 125 | 8 | 78 | 9 | 161 | 10 |
| 288 | 5 | 73 | 8 | 281 | 8 | 5 | 8 | 44 | 9 | 129 | 10 |
| 17 | 5 | 104 | 8 | 135 | 8 | 5 | 8 | 159 | 9 | 45 | 10 |
| 1 | 5 | 40 | 8 | 33 | 8 | 140 | 9 | 61 | 9 | 16 | 10 |
| 35 | 5 | 103 | 8 | 24 | 8 | 287 | 9 | 111 | 9 | 81 | 10 |
| 19 | 5 | 105 | 8 | 75 | 8 | 220 | 9 | 174 | 9 | 7 | 10 |
| 36 | 5 | 57 | 8 | 283 | 8 | 25 | 9 | 144 | 9 | 64 | 10 |
| 20 | 6 | 23 | 8 | 123 | 8 | 137 | 9 | 175 | 9 | 193 | 10 |
| 52 | 6 | 84 | 8 | 284 | 8 | 254 | 9 | 160 | 9 | 222 | 10 |
| 53 | 6 | 67 | 8 | 152 | 8 | 93 | 9 | 190 | 9 | 225 | 10 |
| 34 | 6 | 277 | 8 | 273 | 8 | 237 | 9 | 27 | 9 | 207 | 10 |
| 37 | 6 | 275 | 8 | 108 | 8 | 60 | 9 | 119 | 9 | 47 | 10 |
| 2 | 6 | 276 | 8 | 169 | 8 | 141 | 9 | 176 | 9 | 226 | 10 |
| 54 | 6 | 106 | 8 | 42 | 8 | 126 | 9 | 128 | 9 | 146 | 10 |
| 54 | 6 | 278 | 8 | 92 | 8 | 43 | 9 | 62 | 9 | 113 | 10 |
| 69 | 7 | 68 | 8 | 186 | 8 | 142 | 9 | 95 | 9 | 178 | 10 |
| 21 | 7 | 74 | 8 | 285 | 8 | 155 | 9 | 171 | 9 | 177 | 10 |
| 70 | 7 | 4 | 8 | 139 | 8 | 156 | 9 | 79 | 9 | 240 | 10 |
| 38 | 7 | 50 | 8 | 138 | 8 | 271 | 9 | 189 | 9 | 208 | 10 |
| 71 | 7 | 90 | 8 | 59 | 8 | 77 | 9 | 223 | 9 | 28 | 10 |
| 55 | 7 | 101 | 8 | 85 | 8 | 110 | 9 | 112 | 9 | 80 | 10 |
| 51 | 7 | 279 | 8 | 286 | 8 | 102 | 9 | 224 | 9 | 188 | 10 |
| 3 | 7 | 274 | 8 | 286 | 8 | 157 | 9 | 224 | 9 | 63 | 10 |
| 86 | 7 | 280 | 8 | 203 | 8 | 94 | 9 | 45 | 9 | 30 | 10 |
| 87 | 7 | 41 | 8 | 203 | 8 | 143 | 9 | 45 | 9 | 206 | 10 |
| 39 | 7 | 121 | 8 | 124 | 8 | 127 | 9 | 272 | 9 | 130 | 10 |
| 72 | 7 | 58 | 8 | 124 | 8 | 26 | 9 | 272 | 9 | 65 | 10 |
| 22 | 7 | 107 | 8 | 76 | 8 | 173 | 9 | 96 | 9 | 97 | 10 |
| 88 | 7 | 91 | 8 | 76 | 8 | 6 | 9 | 96 | 9 | 98 | 10 |

| Entries 193–224 | | Entries 225–256 | | Entries 257–288 | | Entries 289–320 | | Entries 321–352 | | Entries 353–376 | |
|---|---|---|---|---|---|---|---|---|---|---|---|
| Output | Codeword Length | Output | Codeword Length | Output | Codeword Length | Output | Codeword Length | Output | Codeword Length | Output | Codeword Length |
| 242 | 10 | 205 | 10 | 213 | 10 | 198 | 11 | 215 | 11 | 235 | 11 |
| 82 | 10 | 116 | 10 | 213 | 10 | 198 | 11 | 215 | 11 | 235 | 11 |

DECODE TABLE 2 (HCB_11) -continued

| | | | | | | | | | | | |
|---|---|---|---|---|---|---|---|---|---|---|---|
| 194 | 10 | 49  | 10 | 213 | 10 | 201 | 11 | 168 | 11 | 267 | 11 |
| 241 | 10 | 260 | 10 | 213 | 10 | 201 | 11 | 168 | 11 | 267 | 11 |
| 209 | 10 | 259 | 10 | 246 | 10 | 32  | 11 | 10  | 11 | 268 | 11 |
| 227 | 10 | 31  | 10 | 246 | 10 | 32  | 11 | 10  | 11 | 268 | 11 |
| 210 | 10 | 164 | 10 | 246 | 10 | 182 | 11 | 216 | 11 | 219 | 11 |
| 136 | 10 | 83  | 10 | 246 | 10 | 182 | 11 | 216 | 11 | 219 | 11 |
| 195 | 10 | 245 | 10 | 183 | 10 | 184 | 11 | 187 | 11 | 238 | 11 |
| 46  | 10 | 149 | 10 | 183 | 10 | 184 | 11 | 187 | 11 | 238 | 11 |
| 162 | 10 | 230 | 10 | 183 | 10 | 232 | 11 | 218 | 11 | 252 | 11 |
| 243 | 10 | 148 | 10 | 183 | 10 | 232 | 11 | 218 | 11 | 252 | 11 |
| 115 | 10 | 100 | 10 | 247 | 10 | 231 | 11 | 185 | 11 | 236 | 11 |
| 180 | 10 | 66  | 10 | 247 | 10 | 231 | 1I | 185 | 11 | 236 | 11 |
| 257 | 10 | 181 | 10 | 247 | 10 | 200 | 11 | 234 | 11 | 204 | 11 |
| 147 | 10 | 197 | 10 | 247 | 10 | 200 | 11 | 234 | 11 | 204 | 11 |
| 163 | 10 | 212 | 10 | 214 | 10 | 199 | 11 | 13  | 11 | 253 | 11 |
| 244 | 10 | 261 | 10 | 214 | 10 | 199 | 11 | 13  | 11 | 253 | 11 |
| 179 | 10 | 262 | 10 | 214 | 10 | 151 | 11 | 250 | 11 | 14  | 12 |
| 99  | 10 | 150 | 10 | 214 | 10 | 151 | 11 | 250 | 11 | 12  | 12 |
| 196 | 10 | 256 | 10 | 117 | 10 | 249 | 11 | 265 | 11 | 269 | 12 |
| 239 | 10 | 133 | 10 | 117 | 10 | 249 | 1I | 265 | 11 | 255 | 12 |
| 48  | 10 | 153 | 10 | 117 | 10 | 233 | 11 | 266 | 11 | 15  | 12 |
| 114 | 10 | 9   | 10 | 117 | 10 | 233 | 11 | 266 | 11 | 270 | 12 |
| 29  | 10 | 166 | 10 | 134 | 10 | 217 | 11 | 202 | 11 |     |    |
| 229 | 10 | 166 | 10 | 134 | 10 | 217 | 11 | 202 | 11 |     |    |
| 8   | 10 | 166 | 10 | 134 | 10 | 264 | 11 | 251 | 11 |     |    |
| 228 | 10 | 166 | 10 | 134 | 10 | 264 | 11 | 251 | 11 |     |    |
| 131 | 10 | 165 | 10 | 167 | 11 | 248 | 11 | 221 | 11 |     |    |
| 211 | 10 | 165 | 10 | 167 | 11 | 248 | 11 | 221 | 11 |     |    |
| 132 | 10 | 165 | 10 | 263 | 11 | 170 | 11 | 11  | 11 |     |    |
| 258 | 10 | 165 | 10 | 263 | 11 | 170 | 11 | 11  | 11 |     |    |

What is claimed:

1. A bitstream decoding method comprising the step of:
   performing a two-table lookup, said two-table lookup comprising the steps of:
   addressing a first table in response to a first plurality of bits from said bitstream; and
   generating an address into a second table using a first value in an entry in said first table accessed in said addressing step; and
   outputting a second value contained in an entry in said second table at said address from said generating step.

2. The method of claim 1 wherein said step of generating said address comprises the steps of:
   retrieving said first value from a first portion of said entry in said first table; and
   offsetting said first value by a third value represented by an additional number of bits in said bitstream.

3. The method of claim 2 wherein said step of generating said address further comprises the steps of:
   retrieving a third value from a second portion of said entry in said first table; and
   extracting said additional number of bits from said bitstream, wherein said additional number of bits corresponds to said third value.

4. The method of claim 2 wherein said second value contained in said entry in said second table is contained in a first portion of said entry in said second table, and wherein said two-table lookup further comprises the steps of:
   retrieving a fifth value from a second portion of said entry in said second table; and
   returning to said bitstream a number of bits from said first plurality of bits corresponding to a difference between a number of bits in said first plurality of bits and said fifth value.

5. The method of claim 1 further comprising the step of:
   selecting a decoding process from a predetermined set of decoding processes in response to a code descriptor obtained from a portion of said bitstream, said set of decoding processes including said two-table lookup.

6. The method of claim 5 wherein said set of decoding processes further includes a binary search process.

7. The method of claim 1 wherein said first table comprises a plurality of entries, each entry of said plurality of entries comprising a first portion for holding a base address and a second portion holding a value representing a number of additional bits to be extracted from said bitstream.

8. The method of claim 1 wherein said second table comprises a plurality of entries, each entry of said plurality of entries comprising a first portion for holding an output value and a second portion for holding a length of a codeword representing an encoding of said output value.

9. A signal processing system comprising:
   an input port configured to receive an encoded digital signal; and
   a processor, including:
   a first table;
   a second table; and
   a decoder, coupled to said first and second tables, configured to decode said encoded digital signal;
   wherein said decoder comprises:
   circuitry configured to address an entry in said first table in response to a plurality of bits in a bitstream of said encoded digital signal;
   circuitry configured to generate an address into said second table in response to a value in a first portion of said entry in said first table; and
   circuitry configured to output a value in a first portion of an entry in said second table, said entry corresponding to said address, said value representing a decoded value of a codeword in said encoded digital signal.

10. The system of claim 9 wherein said circuitry configured to generate said address into said second table includes:
   circuitry configured to retrieve said value in said first portion of said entry in said first table; and
   circuitry configured to offset said value in said first portion of said entry by a value of an additional number of bits in said bitstream.

11. The system of claim 10 wherein said circuitry configured to generate said address into said second table further includes:
   circuitry configured to retrieve a value in a second portion of said entry in said first table; and
   circuitry configured to extract said additional number of bits in response to said value in said second portion of said entry in said first table.

12. The system of claim 10 wherein said decoder further comprises circuitry configured to return a number of bits to said bitstream corresponding to a difference between a value in a second portion of said entry in said second table and said number of additional bits.

13. The system of claim 9 further comprising a memory, wherein at least a portion of said memory comprises memory for storing said first table and said second table.

14. The system of claim 9 wherein said circuitry configured to address an entry in said first table, said circuitry configured to generate an address into said second table, and circuitry configured to output a value in a first portion of an entry in said second table comprises circuitry for performing a first decode process, and wherein said decoder further comprises circuitry configured to select, in response to a code descriptor in a portion of said bitstream, between said circuitry for performing said first decode process and circuitry configured to perform a second decode process.

15. The system of claim 14 wherein said second decode process comprises a binary search process.

16. The system of claim 9 wherein said first table comprises a plurality of entries, each entry of said plurality of entries comprising a first portion for holding a base address and a second portion for holding a value representing a number of additional bits to be extracted from said bitstream.

17. The system of claim 9 wherein said second table comprises a plurality of entries, each entry of said plurality of entries comprising a first portion for holding an output value and a second portion for holding a length of a codeword representing an encoding of said output value.

18. A bitstream decoding method comprising the step of:
   selecting a decoding process from a predetermined set of decoding processes in response to a current codebook used to encode said bitstream; and
   decoding said bitstream using said decoding process from said selecting step.

19. The method of claim 18 wherein said set of decoding processes includes a two-table lookup process.

20. The method of claim 19 wherein said set of decoding processes further includes a binary search process, a linear search process and a single table lookup process.

21. The method of claim 19 wherein said decoding process is selected in response to a code descriptor in a portion of said bitstream.

22. The method of claim 18 wherein a current codebook is one of an Advanced Audio enCoding (AAC) Huffman codebook 10 (HCB_10) and an AAC Huffman codebook 11 (HCB_11) and wherein said decoding process from said selecting step comprises a two-table lookup process.

23. A signal processing system comprising:
   an input port configured to receive an encoded digital signal; and
   a decoder, configured to decode said encoded digital signal; wherein said decoder comprises:
      circuitry configured for selecting a decoding process from a predetermined set of decoding processes in response to a current codebook used to encode said bitstream; and
      circuitry configured for decoding said bitstream using said decoding process from said selecting step.

24. The system of claim 23 wherein said set of decoding processes includes a two-table lookup process.

25. The system of claim 24 set of decoding processes further includes a binary search process, a linear search process and a single table lookup process.

26. The system of claim 23 wherein said decoder further comprises circuitry configured to select said decoding process in response to a code descriptor in a portion of said bitstream.

* * * * *